United States Patent
Yasutake

(10) Patent No.: US 11,842,951 B2
(45) Date of Patent: Dec. 12, 2023

(54) SEMICONDUCTOR DEVICE FOR IMPROVING HEAT DISSIPATION AND MOUNTING STRUCTURE THEREOF

(71) Applicant: ROHM CO., LTD., Kyoto (JP)

(72) Inventor: Ippei Yasutake, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 266 days.

(21) Appl. No.: 16/903,360

(22) Filed: Jun. 16, 2020

(65) Prior Publication Data

US 2020/0402901 A1 Dec. 24, 2020

(30) Foreign Application Priority Data

Jun. 21, 2019 (JP) .................................. 2019-115522

(51) Int. Cl.
*H01L 23/495* (2006.01)
*H01L 23/498* (2006.01)
(Continued)

(52) U.S. Cl.
CPC .... *H01L 23/49541* (2013.01); *H01L 21/4821* (2013.01); *H01L 21/4825* (2013.01);
(Continued)

(58) Field of Classification Search
CPC ....... H01L 23/498; H01L 23/00; H01L 23/31; H01L 23/49838; H01L 23/49861;
(Continued)

(56) References Cited

U.S. PATENT DOCUMENTS

2005/0106783 A1 5/2005 Miyata
2008/0246132 A1* 10/2008 Kasuya ................... H01L 24/83
257/676
(Continued)

FOREIGN PATENT DOCUMENTS

CN 205944066 U * 2/2017 ............. H01L 23/66
CN 106876359 A * 6/2017 ....... H01L 23/49541
(Continued)

OTHER PUBLICATIONS

Chinese Office Action dated Apr. 28, 2023, issued in corresponding CN application No. 2020104245889, 13 pages, machine translation provided.
(Continued)

*Primary Examiner* — Cheung Lee
(74) *Attorney, Agent, or Firm* — HAMRE, SCHUMANN, MUELLER & LARSON, P.C.

(57) ABSTRACT

A semiconductor device includes a semiconductor element, a first lead (1), a plurality of second leads and a sealing resin. The first lead includes a mounting portion mounting the semiconductor element, four connecting portions extending from four corners of the mounting portion, respectively, and four first terminal portions connected to front ends of the connecting portions, respectively. A part of each first terminal portion is exposed from the sealing resin. The second leads are arranged in a plural quantity between adjacent first terminal portions when viewed in a thickness direction. Each second lead includes a second terminal portion having a part exposed from the sealing resin, and a joining portion extending from the second terminal portion toward the mounting portion. A connecting portion width dimension of the connecting portion is greater than a joining portion width dimension of the joining portion of the second lead adjacent to the connecting portion.

20 Claims, 17 Drawing Sheets

(51) Int. Cl.
*H01L 23/31* (2006.01)
*H01L 23/00* (2006.01)
*H01L 21/48* (2006.01)

(52) U.S. Cl.
CPC ...... *H01L 21/4853* (2013.01); *H01L 23/3107* (2013.01); *H01L 23/3121* (2013.01); *H01L 23/49503* (2013.01); *H01L 23/49548* (2013.01); *H01L 23/49568* (2013.01); *H01L 23/49811* (2013.01); *H01L 23/49838* (2013.01); *H01L 23/49861* (2013.01); *H01L 24/45* (2013.01); *H01L 24/48* (2013.01)

(58) Field of Classification Search
CPC ................ H01L 23/3121; H01L 24/45; H01L 23/49811; H01L 23/3107; H01L 23/49548; H01L 23/49541; H01L 23/49503; H01L 2224/83447; H01L 2224/85447; H01L 2224/8346; H01L 2224/32245; H01L 2224/83444; H01L 2224/85455; H01L 2224/8546; H01L 2224/45124; H01L 24/48; H01L 2224/29099; H01L 2224/45147; H01L 2224/83455; H01L 2224/49173; H01L 2224/45144; H01L 2224/73265; H01L 2224/85444; H01L 2224/48245; H01L 2924/00014; H01L 2924/013; H01L 2924/01404; H01L 2924/13; H01L 21/4814; H01L 21/4821; H01L 21/4853; H01L 23/49568; H01L 21/4825; H01L 23/4825

USPC ........................................................ 257/773
See application file for complete search history.

(56) References Cited

U.S. PATENT DOCUMENTS

| | | | | |
|---|---|---|---|---|
| 2013/0140714 | A1* | 6/2013 | Numazaki | H01L 23/49517 257/782 |
| 2016/0276251 | A1* | 9/2016 | Mustanir | H01L 24/97 |
| 2017/0150601 | A1* | 5/2017 | Suzuki | H01L 23/49551 |
| 2018/0077789 | A1* | 3/2018 | Yamazaki | H05K 1/0206 |

FOREIGN PATENT DOCUMENTS

| | | | | |
|---|---|---|---|---|
| JP | 2004228260 A | | 8/2004 | |
| JP | 2005150628 A | | 6/2005 | |
| JP | 2006287073 A | | 10/2006 | |
| JP | 4651218 B2 | * | 3/2011 | ... H01L 2224/45144 |
| JP | 2013021052 A | | 1/2013 | |
| JP | 2016213308 A | | 12/2016 | |
| KR | 10-2018-0075408 | * | 7/2018 | ......... H01L 23/4952 |
| WO | 2009081494 A1 | * | 7/2009 | ....... H01L 23/49582 |

OTHER PUBLICATIONS

Japanese Office Action dated Mar. 24, 2023, issued in corresponding JP application No. 2019-115522, 10 pages, machine translation provided.

Japanese Search report dated Mar. 24, 2023, issued in corresponding JP application No. 2019-115522, 30 pages, machine translation provided.

Office Action issued in Chinese application No. 2020104245889, dated Oct. 14, 2023, with English translation.

* cited by examiner

SEMICONDUCTOR DEVICE FOR IMPROVING HEAT DISSIPATION AND MOUNTING STRUCTURE THEREOF

FIELD OF THE INVENTION

The present invention relates to a semiconductor device and a mounting structure of the semiconductor device.

DESCRIPTION OF THE PRIOR ART

Semiconductor devices in quad flat non-leaded (QFN) packages have been developed as surface-mounted semiconductor devices on wiring substrates. Patent publication 1 discloses an example of a QFN semiconductor device. In a QFN semiconductor device, a plurality of electrode pads are disposed along four side surfaces, respectively. Further, a semiconductor device having a heat sink for releasing heat emitted from a semiconductor element is disposed on a back surface of the QFN semiconductor device.

FIG. 17 shows a bottom view of such conventional semiconductor device A100. The semiconductor device A100 exposes, from the back surface of the sealing resin 5, a first lead mounted with a semiconductor device. When the semiconductor device A100 is mounted on a wiring substrate, the back surface of the first lead 1 is connected to a heat sink land of the wiring substrate. Accordingly, heat emitted by the semiconductor element is transmitted through the first lead 1 to the heat sink land and is released.

Further, electrode pads that expose a plurality of second leads 2 from the back surface of the sealing resin 5 are disposed on the bottom surface of the semiconductor device A100, wherein each of the second leads 2 is connected to a semiconductor element 3 via a bonding wire 4. The plurality of electrodes pads are arranged side-by-side in a plural quantity along each of the four side surfaces. When the semiconductor device A100 is mounted on the wiring substrate, the electrode pads are connected to the electrode pad lands of the wiring substrate, respectively. Accordingly, the electrode pad lands are arranged around the heat sink land. Thus, it would be difficult to expand the heat sink land on the surface of the wiring substrate, or to arrange wires for connecting the electrode pad lands around the heat sink land to the heat sink land. That is to say, it would be difficult to expand the heat dissipation area on the surface of the wiring substrate, in a way that an area sufficient for thorough heat dissipation cannot be ensured on the surface of the wiring substrate.

PRIOR ART DOCUMENT

Patent Document

[Patent document] Japan Patent No. 2013-21052

SUMMARY OF THE INVENTION

Problems to be Solved by the Present Invention

The present invention is conceived of on the basis of the foregoing situations, and aims to provide a semiconductor device that ensures a heat dissipation area on the surface of a mounted wiring substrate.

Technical Means for Solving the Problems

The present invention provides a semiconductor device, including: a semiconductor element; a first lead, being rectangular in shape when viewed in a thickness direction, including a mounting portion, four connecting portions and four first terminal portions, wherein the semiconductor element is mounted on the mounting portion, the connecting portions extend from four corners of the mounting portion, respectively, and the first terminal portions are connected to front ends of the plurality of connecting portions respectively; a plurality of second leads, arranged in a plural quantity in parallel to each edge of the mounting portion between the adjacent first terminal when viewed in the thickness direction; and a sealing resin, covering at least a part of each of the first lead and the second leads. A part of each of the first terminal portions is exposed from the sealing resin. Each of the second leads includes a second terminal portion having a part exposed from the sealing resin, and a joining portion extending from the second terminal portion toward the mounting portion. A dimension of a connecting portion width of the connecting portion is greater than a dimension of a joining portion width of the joining portion of the second lead adjacent to the connecting portion, wherein the dimension of the connecting portion width is a dimension in a direction perpendicular to the extension direction of the connecting portion and the thickness direction, and the dimension of the joining portion width is a dimension in a direction perpendicular to the extension direction of the joining portion and the thickness direction.

Effects of the Present Invention

According to the present invention, the mounting portion mounted with the semiconductor element is connected to the first terminal portions by the connecting portions having a larger width dimension. Because a part of each first terminal portion is exposed from the sealing resin, the exposed parts of the first terminal portions may be connected to the lands on the wiring substrate when the semiconductor device is mounted on the wiring substrate. Thus, the semiconductor device of the present invention is capable of release heat emitted by the semiconductor device to the lands connected to first terminal portions on the wiring substrate via the connection portion. The lands connected to the first terminal portions may be expanded to a region closer to an outer side than a region surrounded by the lands connected to the second leads. Therefore, the semiconductor device of the present invention ensures the heat dissipation area on the surface of the mounted wiring substrate.

Other features and advantages of the present invention are to become more apparent with the details given with the accompanying drawings below.

DETAILED DESCRIPTION OF THE EMBODIMENTS

Figure 1:
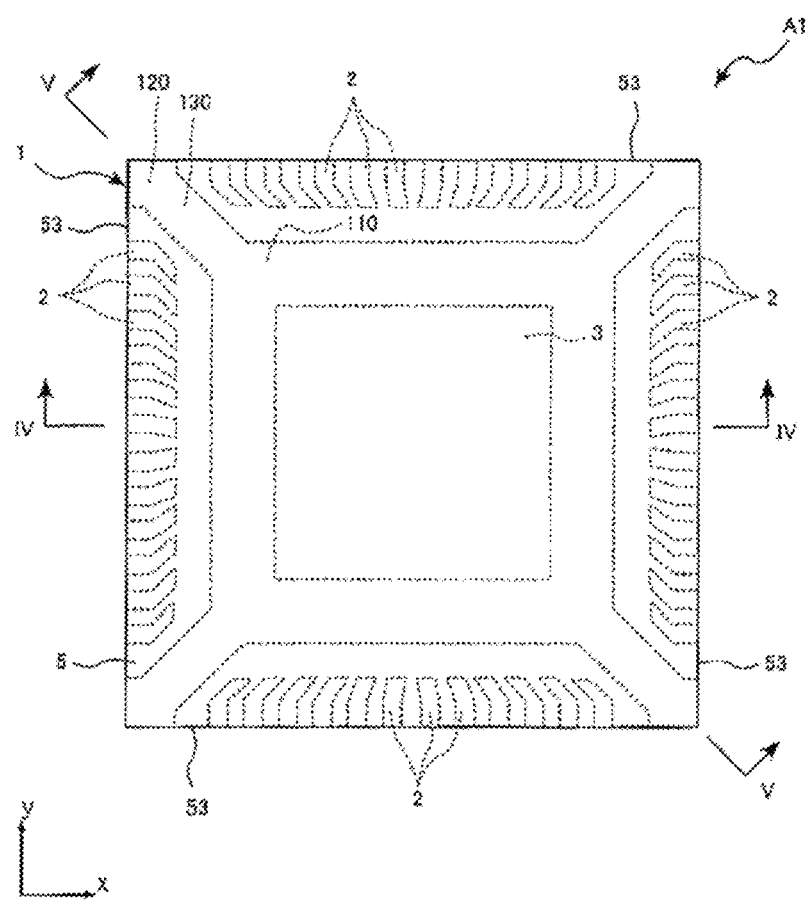
FIG. 1 is a top view of a semiconductor device according to a first embodiment of the present invention.

Specific details of the present invention are given in the preferred embodiments with the accompanying drawings below.

First Embodiment

A semiconductor device A1 according to the first embodiment of the present invention is described with reference to FIG. 1 to FIG. 6. The semiconductor device A1 includes a first lead 1, second leads 2, a semiconductor element 3, bonding wires 4 and a sealing resin 5. The semiconductor device A1 is in a so-called quad flat non-leaded (QFN) package.

Figure 2:
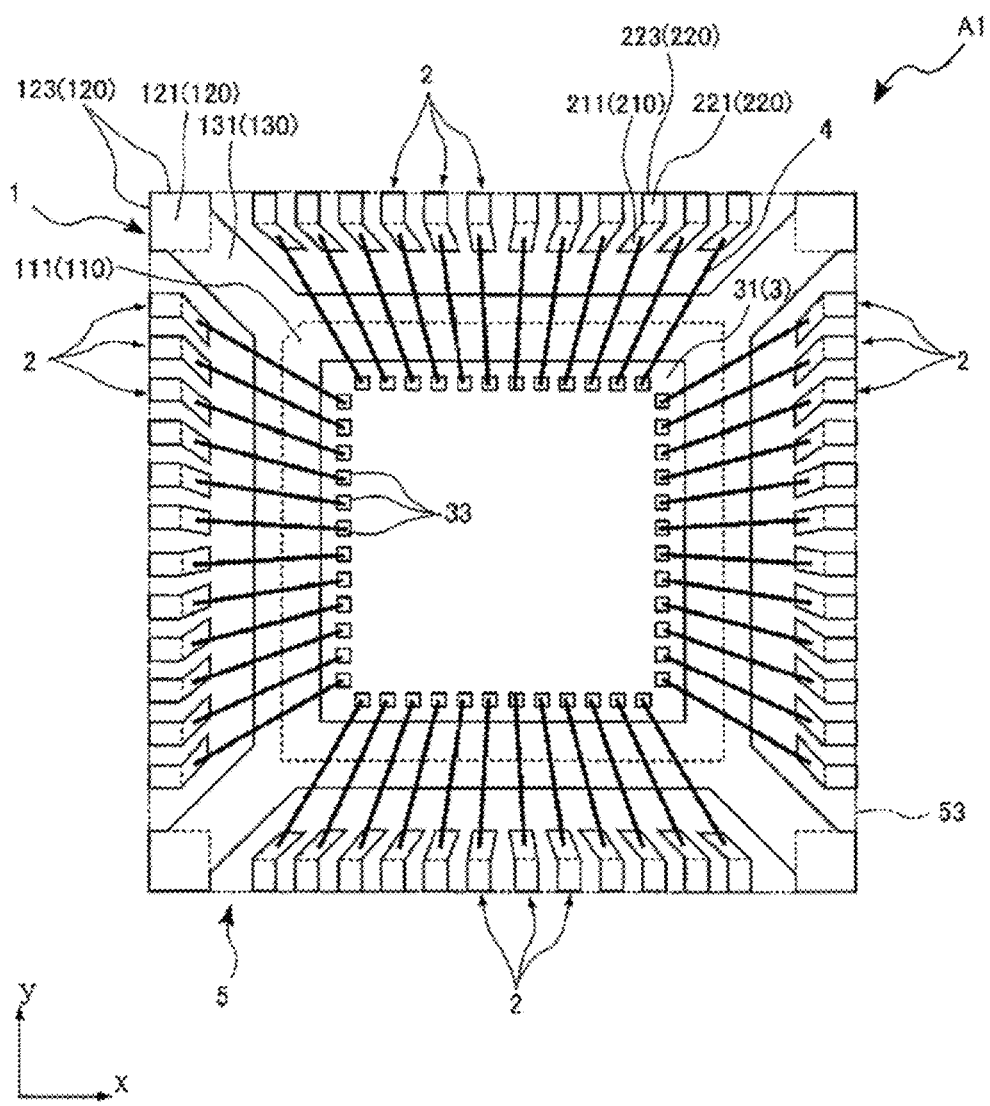
FIG. 2 is a top view of a main part of the semiconductor device in FIG. 1.
Figure 3:
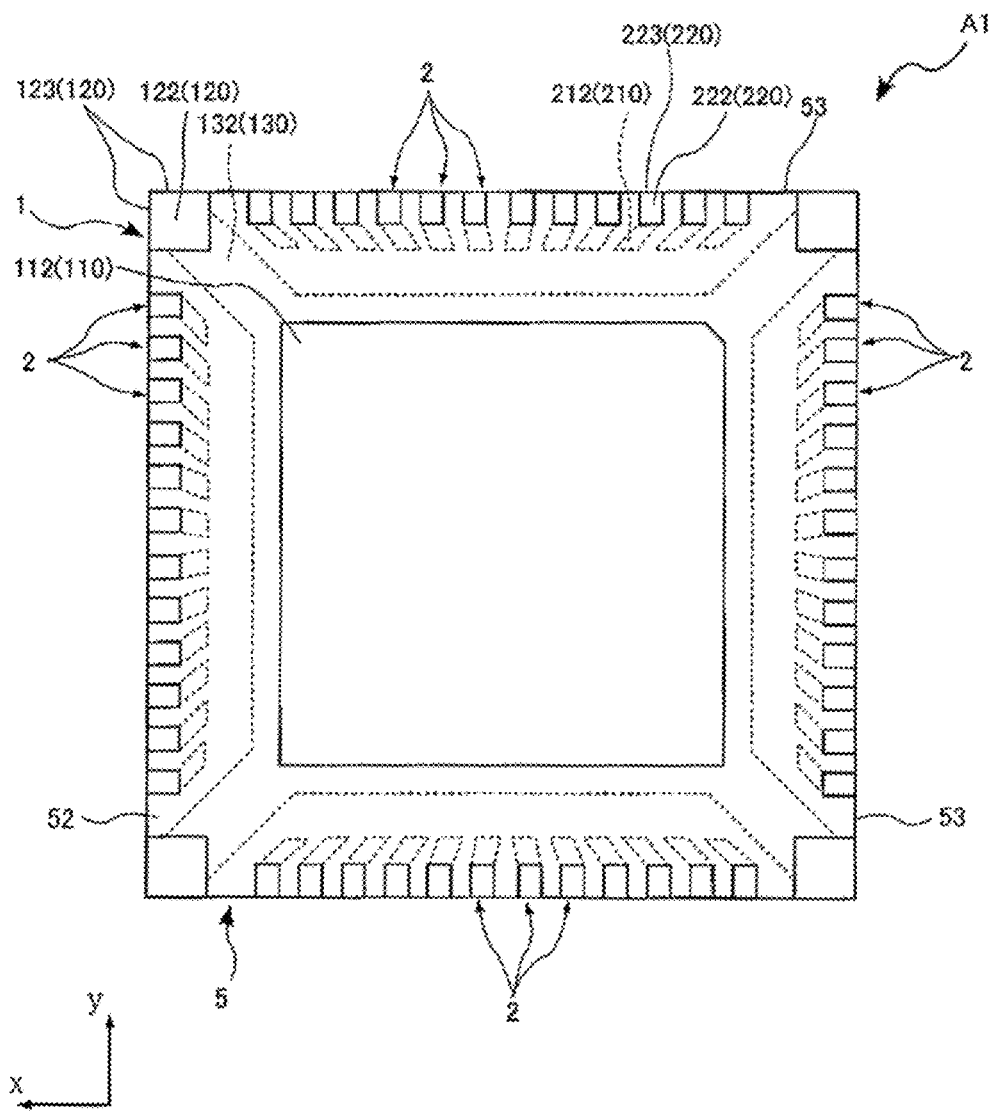
FIG. 3 is a bottom view of the semiconductor device in FIG. 1.
Figure 4:
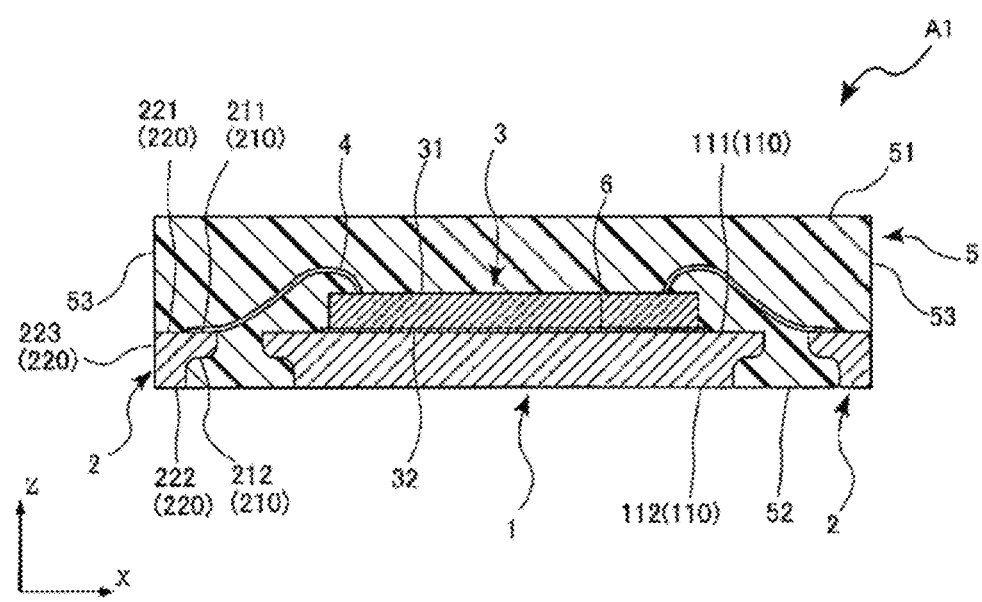
FIG. 4 is a section diagram of FIG. 1 along the line IV-IV.
Figure 5:
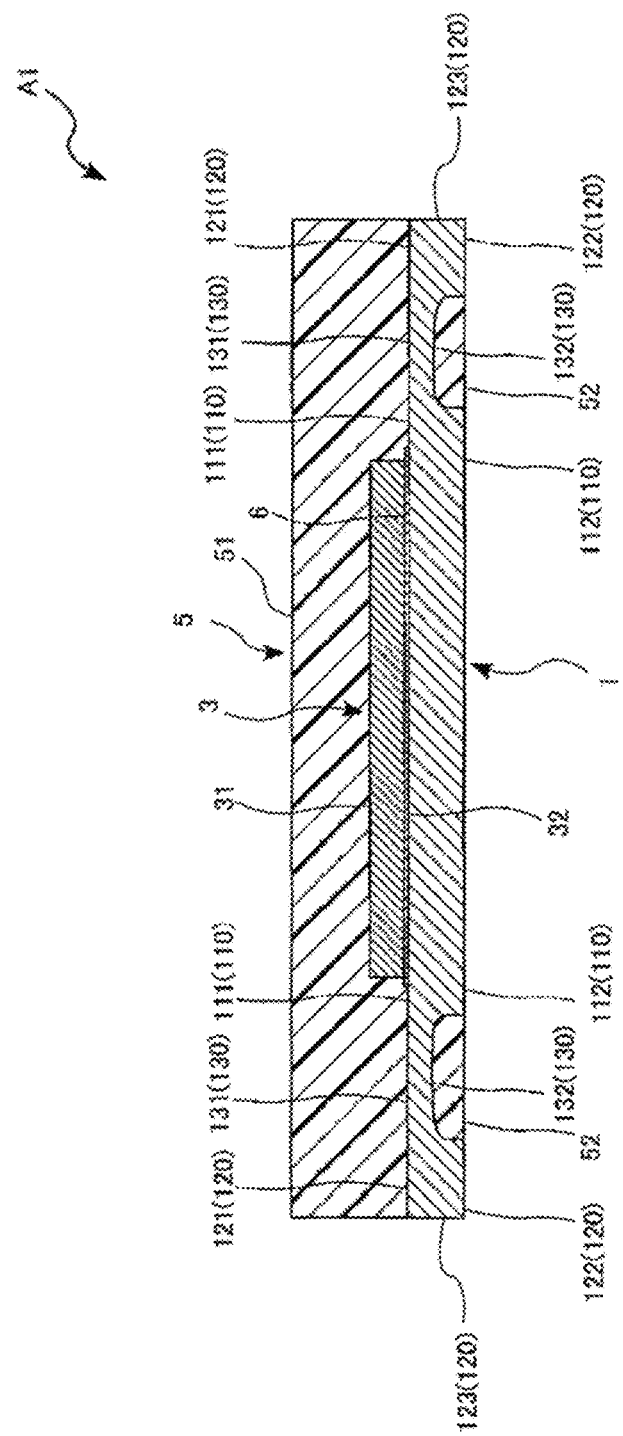
FIG. 5 is a section diagram of FIG. 1 along the line V-V.
Figure 6:
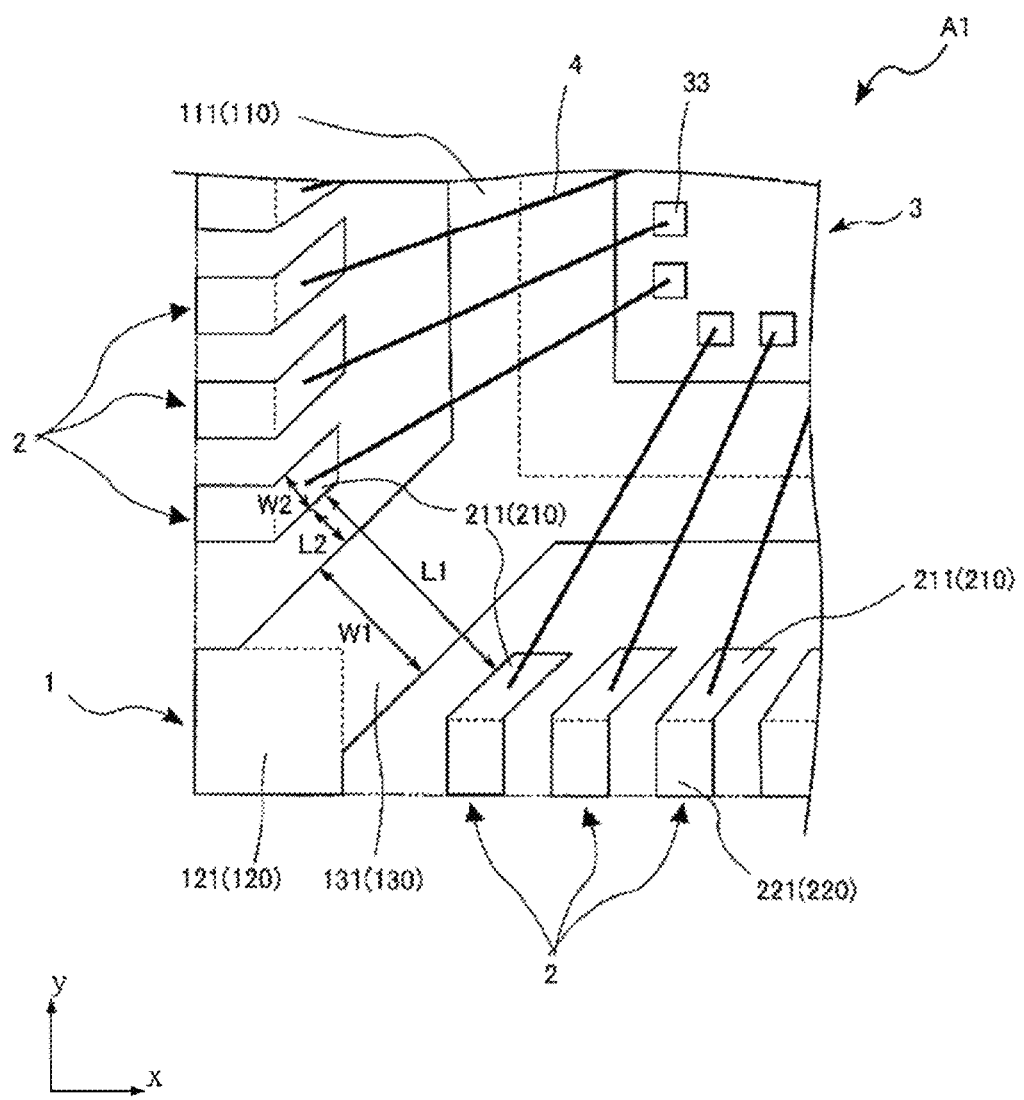
FIG. 6 is an enlarged top view of a main part of the semiconductor device in FIG. 1.

FIG. 1 shows a top view of the semiconductor device A1. FIG. 2 shows a top view of a main part of the semiconductor device A1. FIG. 3 shows a bottom view of the semiconductor device A1. FIG. 4 shows a section diagram of FIG. 1 along the line IV-IV. FIG. 5 shows a section diagram of FIG. 1 along the line V-V. FIG. 6 shows an enlarged top view of the main part. In FIG. 2 and FIG. 6, for better understanding, an imaginary line (double-dotted line) is used for the sealing resin 5 to indicate the contour of the sealing resin 5.

The semiconductor device A1 in these drawings is a device that is surface mounted on a wiring substrate of various apparatuses. When viewed in the thickness direction, the semiconductor device A1 is rectangular in shape. For illustration purposes, the thickness direction of the semiconductor device A1 is set as a z direction, a direction along one side of the semiconductor device A1 (left-right direction in FIG. 1) and perpendicular to the z direction is set as an x direction, and a direction perpendicular to the z direction and the x direction (top-down direction in FIG. 1) is set as a y direction. The dimensions of the semiconductor device A1 are not specifically defined. In this embodiment, for example, the dimension of the semiconductor device A1 in the x direction is approximately 2 to 10 mm, the dimension in the y direction is approximately 2 to 10 mm, and the dimension in the z direction is 0.5 to 2 mm.

The first lead 1 and the second leads 2 contain metal, and preferably contain any one of Cu and Ni, an alloy thereof or a 42 alloy. In this embodiment, an example of the first lead 1 and the second leads 2 containing Cu is described. Each of the first lead 1 and the second leads 2 has a thickness of, for example, 0.08 to 0.5 mm, and approximately 0.125 mm in this embodiment. The first lead 1 and the second leads 2 are formed by, for example, etching processing of a metal plate. Further, the first lead 1 and the second leads 2 may also be formed by implementing punching processing or bending processing on a metal plate.

As shown in FIG. 2, when viewed in the z direction, the first lead 1 is disposed at the center of the semiconductor device A1, and extends to two end portions of the semiconductor device A1 in the x direction and the y direction. The first lead 1 supports the semiconductor element 3 and dissipates heat emitted by the semiconductor element 3. Further, the first lead 1 may also be electrically connected to the semiconductor element 3. The first lead 1 includes a mounting portion 110, four first terminal portions 120 and four connecting portions 130.

The mounting portion 110 is located at the center of the first lead 1 when viewed in the z direction, and is substantially rectangular in shaped when viewed in the z direction. When viewed in the z direction, the sides of the mounting portion 110 are parallel to the x direction or the y direction. The mounting portion 110 has a mounting portion main surface 111 and a mounting portion back surface 112. The mounting portion main surface 111 and the mounting portion back surface 112 face opposite sides in the z direction. The mounting portion main surface 111 is a surface facing the top in FIG. 4 and FIG. 5. The mounting portion main surface 111 is a surface mounted with the semiconductor element 3. The mounting portion back surface 112 is a surface facing the bottom in FIG. 4 and FIG. 5. The mounting portion back surface 112 is exposed from the sealing resin 5, and becomes a back surface terminal. In this embodiment, the mounting portion main surface 111 is larger than the mounting portion back surface 112. Further, the mounting portion main surface 111 and the mounting portion back surface 112 may also be equally sized.

The first terminal portions 120 are disposed on four corners of the semiconductor device A1, respectively, when viewed in the z direction. Each first terminal portion 120 is rectangular in shape when viewed in the z direction. Each first terminal portion 120 has a first terminal portion main surface 121, a first terminal portion back surface 122 and two first terminal portion end surfaces 123. The first terminal portion main surface 121 and the first terminal portion back surface 122 face opposite directions in the z direction. The first terminal portion main surface 121 is surface facing the top in FIG. 4 and FIG. 5. The first terminal portion back surface 122 is a surface facing the bottom in FIG. 4 and FIG. 5. The first terminal portion end surfaces 123 are surfaces connecting the first terminal portion main surface 121 and the first terminal portion back surface 122, and are perpendicular to the first terminal portion main surface 121 and the first terminal portion back surface 122. One of the first terminal portion end surfaces 123 faces an outer side in the x direction, and the other first terminal portion end surface 123 faces an outer side in the y direction. The first terminal portion back surface 122 and the two first terminal portion end surfaces 123 are individually exposed from the sealing resin 5 and are connected to one another to become terminals (referring to FIG. 5).

Each connecting portion 130 is connected to the mounting portion 110 and the respective first terminal portion 120. The connecting portions 130 extend radially from the four corners of the mounting portion 110 at the center of the semiconductor device A1, respectively, when viewed in the z direction, and are connected to the respective first terminal portions 120 disposed on the four corners of the semiconductor device A1. The connecting portions 130 have a thickness (the dimension in the z direction) of approximately one-half of the thickness of the mounting portion 110. The connecting portions 130 are formed by, for example, half-etching processing. Each connecting portion 130 has a connecting portion main surface 131 and a connecting portion back surface 132. The connecting portion main surface 131 and the connecting portion back surface 132 face opposite sides in the z direction. The connecting portion main surface 131 is a surface facing the top in FIG. 4 and FIG. 5. The connecting portion main surfaces 131, the mounting portion main surface 111 and the first terminal portion main surfaces 121 are an integral surface (referring to FIG. 2 and FIG. 5) of a same plane. The connecting portion back surface 132 is a surface facing the bottom in FIG. 4 and FIG. 5.

A surface coating layer (not shown) is formed on all parts of the first lead 1 that are exposed from the sealing layer 5. In this embodiment, a surface coating layer is formed on the mounting portion back surface 112, the first terminal portion back surfaces 122 and the first terminal portion end surfaces 123. The surface coating layer contains a material having solder wettability more than that of the base material of the first lead 1, and contains, for example, Au in this embodiment. The surface coating layer is formed by, for example, substitution electroless plating. Further, forming of the surface coating layer is optional As shown in FIG. 2, the plurality of second leads 2 are arranged at intervals on two end portions of the semiconductor device A1 in the x direction or on two end portions of the semiconductor device A1 in the y direction, and are spaced from the first lead 1. More specifically, between two first terminal portions 120 disposed on one end of the semiconductor device A1 (the upper end in FIG. 2) in the y direction, a plurality of second leads 2 are arranged in a row in parallel to an edge of one side of the mounting portion 110 (the upper side in FIG. 2) in the y direction. Further, between two first terminal portions 120 disposed on another end of the semiconductor device A1 (the lower end in FIG. 2) in the y direction, a plurality of second leads 2 are arranged in a row in parallel to an edge of another side of the mounting portion 110 (the lower side in FIG. 2) in the y direction. Further, between two first terminal portions 120 disposed on one end of the semiconductor device A1 (the right end in FIG. 2) in the x direction, a plurality of second leads 2 are arranged in one column in parallel to an edge of one side of the mounting portion 110 (the right side in FIG. 2) in the x direction. Further, between two first terminal portions 120 disposed on another end of the semiconductor device A1 (the left end in FIG. 2) in the x direction, a plurality of second leads 2 are arranged in one column in parallel to an edge of another side of the mounting portion 110 (the left side in FIG. 2) in the x direction.

The second leads 2 are electrically connected to the semiconductor element 3 by the bonding wires 4, respectively. Each second lead 2 includes a joining portion 210 and a second terminal portion 220.

The second terminal portion 220 is rectangular in shape when viewed in the z direction. In the second leads 2, the mounting portion 110 with respect to the first lead 1 is disposed on an opposite side. The second terminal portion 220 has a second terminal portion main surface 221, a second terminal portion back surface 222 and a second terminal portion side surface 223. The second terminal portion main surface 221 and the second terminal portion back surface 222 face opposite sides in the z direction. The second terminal portion main surface 221 is a surface facing the top in FIG. 4 and FIG. 5. The second terminal portion back surface 222 is a surface facing the bottom of FIG. 4 and FIG. 5. The second terminal portion end surface 223 is a surface connecting the second terminal portion main surface 221 and the second terminal portion back surface 222, and faces, in the second terminal portion 220, a side opposite to the mounting portion 110 of the first lead 1. The second terminal portion back surface 222 and the second terminal portion end surface 223 are individually exposed from the sealing resin 5 and are connected to each other to form terminals (referring to FIG. 4).

The joining portion 210 extends from the second terminal portion 220 toward the mounting portion 110 of the first lead 1. In this embodiment, as the second leads 2 arranged in parallel to the edges on two sides of the mounting portion 110 in the y direction are disposed closer the sides on two ends in the x direction, the more inclining the joining portion 210 is relative to the y direction. Further, as the second leads 2 arranged in parallel to the edges on two sides of the mounting portion 110 in the x direction are disposed closer the sides on two ends in the y direction, the more inclining the joining portion 210 is relative to the x direction. The design above is aimed to more readily connect the semiconductor element 3 mounted on the mounting portion main surface 111 to the second terminal portions 220 of the second leads 2 by the bonding wires 4. In this embodiment, the joining portions 210 of the second leads 2 respectively disposed closest to the side on the two ends (adjacent to the connecting portions 130) extend substantially in parallel to the extension directions of the adjacent connecting portions 130. Further, whether or not the joining portions 210 are inclined relative to the x direction or the y direction is optional.

The joining portions 210 have a thickness (dimension in the z direction) that is approximately one-half of the thickness of the second terminal portions 220. The joining portions 210 are formed by, for example, half-etching processing. Each joining portion 210 has a joining portion main surface 211 and a joining portion back surface 212. The joining main surface 211 and the joining portion back surface 212 face opposite sides in the z direction. The joining portion main surface 211 is a surface facing the top in FIG. 4 and FIG. 5. The joining portion main surface 211 is a surface for bonding to the bonding wires 4. The joining portion main surface 211 and the second terminal portion main surface 221 are of the same plane (referring to FIG. 2 and FIG. 4). The joining portion back surface 212 is a surface facing the bottom in FIG. 4 and FIG. 5. Further, the joining portions 210 may also have a thickness equal to the thickness of the second terminal portions 220. In this case, the joining portion back surfaces 212 and the second terminal portion back surfaces 222 are of the same plane.

A surface coating layer (not shown) is formed on all parts of the second leads 2 that are exposed from the sealing layer 5. In this embodiment, the surface coating layer is formed on the second terminal portion back surfaces 222 and the second terminal portion end surfaces 223. This surface coating layer is the same with the surface coating layer of the first lead 1, for example, containing Au and formed by substitution electroless plating. Further, forming of the surface coating layer is optional.

In this embodiment, as shown in FIG. 6, the dimension of the connecting portion 130 of the first lead 1 in a direction perpendicular to the extension direction of the connecting portion 130 and the z direction, that is, a connecting portion width dimension W1, is sufficiently large. More specifically, the connecting portion width dimension W1 is greater than a joining portion width dimension W2 of the joining portion 210 of the second lead 2 adjacent to the connecting portion 130, and is approximately three times the joining portion width dimension W2, wherein the joining portion width dimension W2 is a dimension in a direction perpendicular to the extension direction of the joining portion 210 and the z direction. Further, the connecting portion width dimension W1 is not specifically defined, and is ideally equal to or more than twice the joining portion width dimension W2. In this embodiment, the connecting portion width dimension W1 is approximately 0.3 mm. Further, the connecting portion width dimension W1 is preferably equal to or more than 0.2 mm.

Further, in this embodiment, as shown in FIG. 6, a minimum distance L1 between (the joining portion 210 of) two second leads 2 adjacent to the connecting portion 130 of the first lead 1 and interposed with the connecting portion 130 is sufficiently large. More specifically, the minimum distance L1 is approximately five times a minimum distance L2 between one of the second leads 2 and the connecting portion 130. Further, the minimum distance L1 is not specifically defined, and is ideally at least four times the minimum distance L2. That is to say, an ideal ratio of the minimum distance L2 to the minimum distance L1 is equal to or less than ¼.

The semiconductor element 3 is an element that practices electrical functions of the semiconductor device A1. The semiconductor element 3 is not limited to a specific type, and may be appropriately selected from various type of integrated circuit elements, an active functional element or a passive functional element. As shown in FIG. 1 and FIG. 2, in this embodiment, the semiconductor element 3 is rectangular in shape when viewed in the z direction.

The semiconductor element 3 has an element main surface 31, an element back surface 32 and a plurality of electrode pads 33. The element main surface 31 and the element back surface 32 face opposite sides in the z direction. The element main surface 31 is a surface facing the top in FIG. 4 and FIG. 5. The element back surface 32 is a surface facing the bottom in FIG. 4 and FIG. 5. As shown in FIG. 2, the plurality of electrode pads 33 are disposed on the element main surface 31, and are disposed in a plural quantity in a row on each edge of the rectangular element main surface 31 in this embodiment. Further, the configuration of the electrode pads 33 is not specifically defined. The semiconductor element 3 is mounted on the mounting main surface 111 of the first lead 1. More specifically, the element back surface 32 of the semiconductor element 3 is mounted on the mounting main surface 111 by a bonding material 6. The bonding material 6 includes common insulative bonding materials or electrically conductive bonding materials. In this embodiment, an insulative bonding material is used as the bonding material 6 because electrode pads are not disposed on the element back surface 32. Further, when electrode pads are disposed on the element back surface 32 and the electrode pads are electrically connected to the first lead 1, an electrically conductive bonding material is used as the bonding material 6.

The plurality of bonding wires 4 electrically connect the semiconductor element 3 to the second leads 2. In this embodiment, the plurality of electrode pads 33 formed on the element main surface 31 of the semiconductor element 3 are connected to the joining portion main surfaces 211 of the plurality of second leads 2 by the plurality of bonding wires 4, respectively. The material of the bonding wires 4 is not specifically defined, and may be, for example, Au, Al and Cu. In this embodiment, the bonding wires 4 contain, for example, Au.

The sealing resin 5 covers a part of each of the first lead 1 and the second leads 2, the semiconductor element 3 and the bonding wires 4. The sealing resin 5 includes, for example, black epoxy. Further, the material of the sealing resin 5 is not specifically defined.

The sealing resin 5 has a resin main surface 51, a resin back surface 52 and resin side surfaces 53. The resin main surface 51 and the resin back surface 52 face opposite sides in the z direction. The resin main surface 51 is a surface facing the top in FIG. 4 and FIG. 5. The resin back surface 52 is a surface facing the bottom in FIG. 4 and FIG. 5. The resin side surfaces 53 are surfaces connecting the resin main surface 51 and the resin back surface 52. In this embodiment, the resin side surfaces 53 are four in quantity, and individually face the x direction or the y direction.

The sealing resin 5 covers parts other than the mounting portion back surface 112, the first terminal portion back surface 122 and the first terminal portion side surfaces 123 in the first lead 1. The mounting portion back surface 112, the first terminal portion back surface 122 and the first terminal portion side surfaces 123 are exposed from the sealing resin 5. The mounting portion back surface 112, the first terminal portion back surface 122 and the resin back surface 52 are of the same plane. The first terminal portion end surfaces 123 and the resin side surfaces 53 are of the same plane. Further, the sealing resin 5 covers parts other than the second terminal portion back surfaces 222 and the second terminal portion end surfaces 223 of the second leads 2. The second terminal portion back surface 222 and the second terminal portion end surfaces 223 are exposed from the sealing resin 5. The second terminal portion back surfaces 222 and the resin back surface 52 are of the same plane. The second terminal portion end surfaces 223 and the resin side surfaces 53 are of the same plane.

Figure 7:
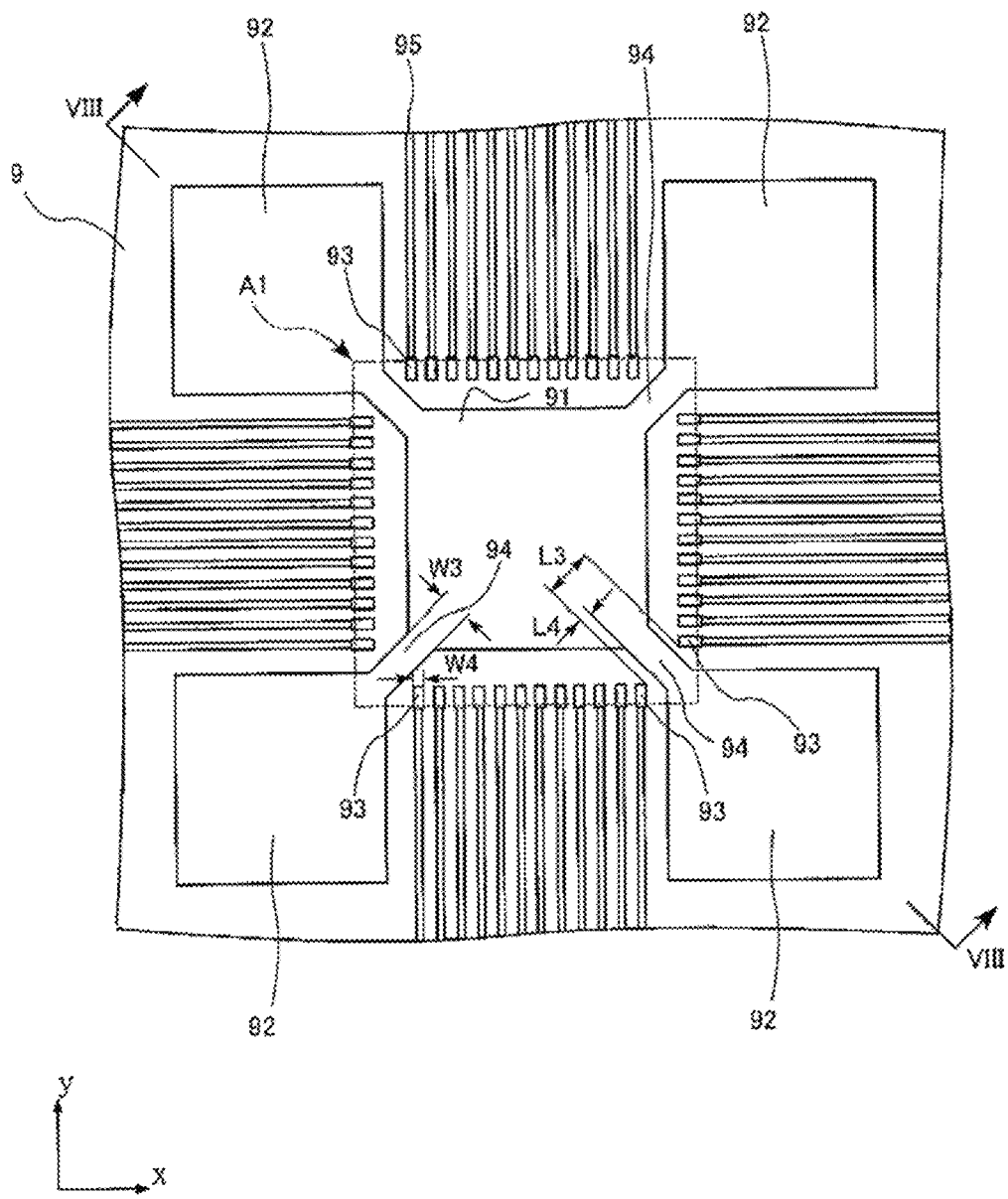
FIG. 7 is a top view of a state in which the semiconductor device in FIG. 1 is mounted on a wiring substrate.
Figure 8:
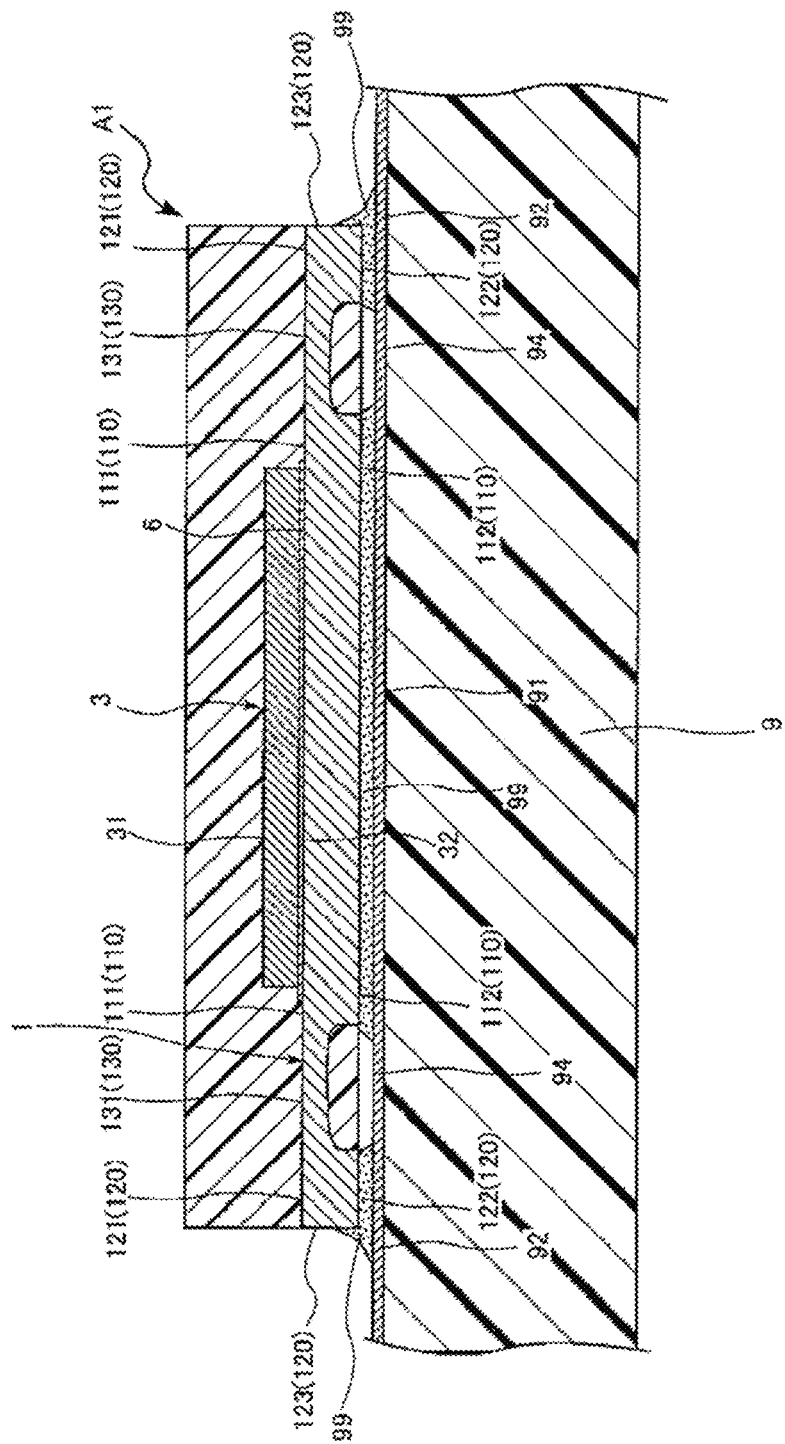
FIG. 8 is an enlarged section diagram of a main part of FIG. 7 along the line VIII-VIII.

Next, details of mounting the semiconductor device A1 on the wiring substrate are given below. FIG. 7 and FIG. 8 are drawings for illustrating mounting structures of the semiconductor device A1 on a wiring substrate 9. FIG. 7 shows a top view of a state in which the semiconductor device A1 is mounted on the wiring substrate 9. FIG. 8 shows an enlarge section diagram of a main part of FIG. 7 along the line VIII-VIII. Further, in FIG. 7, an imaginary line (double-dotted line) is used for the semiconductor device A1 to indicate the contour of the semiconductor device A1.

The wiring substrate 9 is, for example, a substrate formed by a base material containing glass epoxy and having a Cu-containing wiring pattern formed thereon. Further, the materials of the base material and the wiring pattern are not specifically defined. As shown in FIG. 7, the wiring substrate 9 includes a mounting portion land 91, first terminal portion lands 92, second terminal portion lands 93, connecting wires 94 and second terminal portion connecting wires 95 as the wiring pattern.

The mounting portion land 91 is a rectangular land, and has sides thereof disposed in parallel to the x direction or the y direction. Each first terminal portion land 92 is a rectangular land located on a line elongated from the diagonal line of the mounting portion land 91. For one mounting portion land 91, four first terminal portion lands 92 are disposed around the mounting portion land 91. The sides of each first terminal portion land 92 are parallel to the sides of the mounting portion land 91. That is to say, the sides of each first terminal portion land 92 are parallel to the x direction or the y direction. Each connecting wire 94 is a wire connecting the mounting portion land 91 with the first terminal portion land 92, and extends along the direction of the diagonal line of the mounting portion land 91. Four connecting wires 94 are disposed for one mounting portion land 91, and each connecting wire 94 is connected to the mounting portion land 91 and any one of the four first terminal portion lands 92. In the semiconductor device A1, in order to arrange the connecting portion 130, the gap (the minimum distance L1) between two second leads 2 individually adjacent to the connecting portion 130 and interposed with the connecting portion 130 is sufficiently large. Thus, the gap between two second terminal portion lands 93 respectively connected to the two second leads 2 also becomes sufficiently large. Therefore, the connecting wire 94 may be disposed between the two second terminal portion lands 93.

The second terminal portions 93 are shaped as long rectangles extending toward the mounting portion land 91, and are disposed in a plural quantity around the mounting portion land 91. The second terminal portion lands 93 are spaced from one another between two adjacent first terminal portion lands 92, and are disposed at intervals from the mounting portion land 91, the first terminal portion lands 92 and the connecting wires 94. More specifically, between two first terminal portion lands 92 disposed on one side (the upper side in FIG. 7) of the mounting portion land 91 in the y direction, a plurality of second terminal portion lands 93 are arranged in a row in parallel to the x direction. Further, between two first terminal portion lands 92 disposed on another side (the lower side in FIG. 7) of the mounting portion land 91 in the y direction, a plurality of second terminal portion lands 93 are arranged in a row in parallel to the x direction. Further, between two first terminal portion lands 92 disposed on one side (the right side in FIG. 7) of the mounting portion land 91 in the x direction, a plurality of second terminal portion lands 93 are arranged in a row in parallel to the y direction. Further, between two first terminal portion lands 92 disposed on another side (the left side in FIG. 7) of the mounting portion land 91 in the x direction, a plurality of second terminal portion lands 93 are arranged in a row in parallel to the y direction. The second terminal portion connecting wires 95 are wires connected to the second terminal portion lands 93. One second terminal portion connecting wire 95 is disposed for one second terminal portion land 93, and so the second terminal portion connecting wires 95 are disposed in a quantity equal to that of the second terminal portion lands 93. Each second terminal portion connecting wire 95 extends toward a side opposite to the mounting portion land 91 with respect to the respective second terminal portion land 93.

In this embodiment, as shown in FIG. 7, the dimension of each connecting wire 94 in a direction perpendicular to the extension direction of the connecting wire 94 and the z direction, that is, a connecting wire width dimension W3, is sufficiently large. More specifically, the connecting wire width dimension W3 is greater than a second terminal portion land width dimension W4 of the second terminal portion land 93 adjacent to the connecting wire 94, and is approximately three times the second terminal portion land width dimension W4, wherein the second terminal portion land width dimension W4 is a dimension in a direction perpendicular to the extension direction of the second terminal portion land 93 and the z direction. Further, the connecting wire width dimension W3 is not specifically defined, and is ideally equal to or more than twice the second terminal portion land width dimension W4. In this embodiment, the connecting wire width dimension W3 is approximately 0.3 mm. Further, the connecting wire width dimension W3 is ideally equal to or more than 0.2 mm.

Further, in this embodiment, as shown in FIG. 7, a minimum distance L3 between two second terminal portion lands 93 individually adjacent to the connecting wire 94 and interposed with the connecting wire 94 is sufficiently large. More specifically, the minimum distance L3 is approximately five times a minimum distance L4 between one of the two second terminal portion lands 93 and the connecting wire 94. Further, the minimum distance L3 is not specifically defined, and is ideally at least four times the minimum distance L4. That is to say, a ratio of the minimum distance L4 to the minimum distance L3 is ideally equal to or less than ¼.

Further, the shapes of the mounting portion land 91, the first terminal portion lands 92 and the second terminal portion lands 93 are not limited to being rectangles.

The semiconductor device A1 is mounted on the wiring substrate 9, and as shown in FIG. 8, the terminals are bonded to the wiring pattern of the wiring substrate 9 by a solder 99. The mounting back surface 112 of the first lead 1 is bonded to the mounting portion land 91. The first terminal portion back surface 122 of the first lead 1 is bonded to any one first terminal portion land 92. The second terminal portion back surface 222 of one second lead 2 is bonded to any one second terminal portion land 93.

Further, the mounting portion land 91 and the first terminal portion lands 92 may also be connected through vias to a wiring pattern disposed inside the wiring substrate 9 or a wiring pattern formed on a surface of an opposite side.

Next, effects of the semiconductor device A1 are described below.

According to the embodiment, the semiconductor device A1 enables the mounting portion back surface 112 exposed from the sealing resin 5 to be connected to the mounting portion land 91, thereby being mounted to the wiring substrate 9. The semiconductor element 3 is mounted on the mounting portion 110. The mounting portion land 91 is connected to the first terminal portion land 92 by the connecting wire 94. In contribution to the sufficiently large connecting wire width dimension W3, heat emitted by the semiconductor element 3 is transmitted through the mounting portion 110, the mounting portion land 91 and the connecting wires 94 to the first terminal portion lands 92 and is released. That is to say, a heat dissipation area on the wiring substrate 9 is enlarged to a total area of the mounting portion land 91, the connecting wires 94 and the first terminal portion lands 92. Therefore, the semiconductor device A1 ensures the heat dissipation area on the surface of the wiring substrate 9.

Further, according to the embodiment, the mounting portion 110 mounted with the semiconductor element 3 is connected to the first terminal portions 120 by the connecting portions 130. The first terminal portion back surfaces 122 are exposed from the sealing resin 5. The semiconductor device A1 enables the first terminal portion back surfaces 122 to be connected to the first terminal portion lands 92, thereby being mounted to the wiring substrate 9. In contribution to the sufficiently large connecting portion width dimension W1, heat emitted from the semiconductor element 3 is transmitted through the mounting portion 110, the connecting portions 130 and the first terminal portions 120 to the first terminal portion lands 92 on the wiring substrate 9 and is released. That is to say, the semiconductor device A1 further promotes heat dissipation toward the first terminal portion lands 92 using the connecting portions 130 and the first terminal portions 120.

Figure 9:
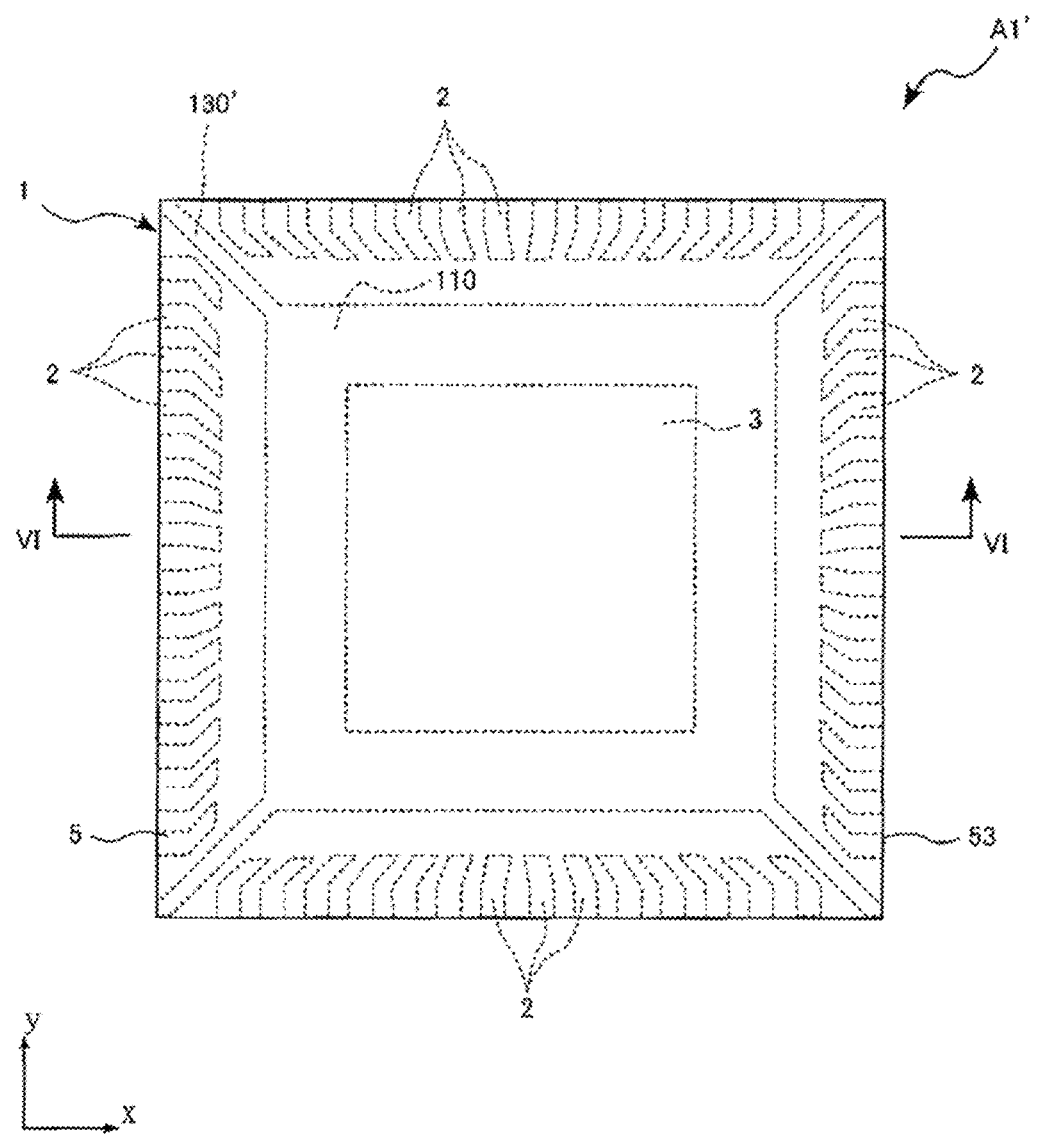
FIG. 9 is a top view of a semiconductor device used for comparison.
Figure 10:
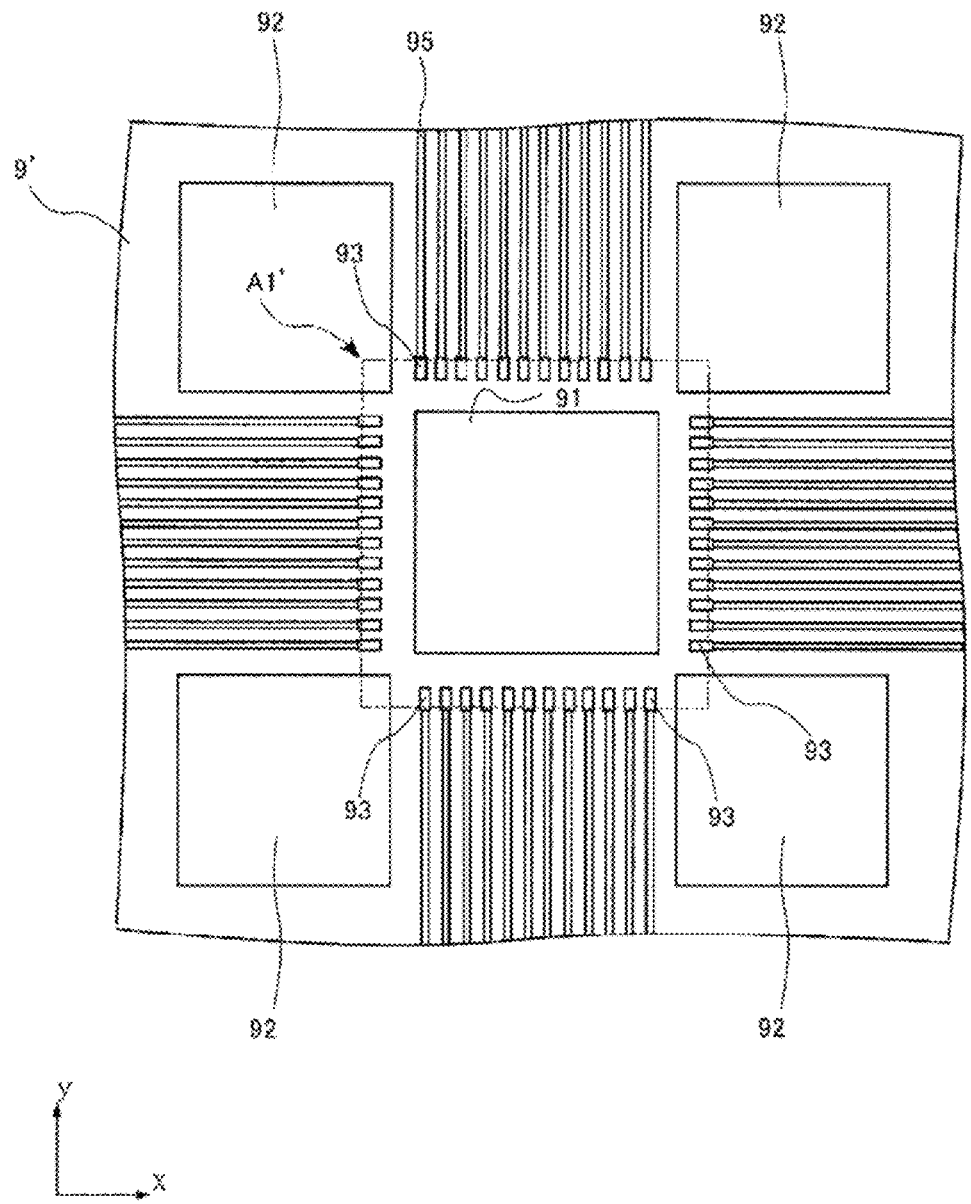
FIG. 10 is a top view of a state in which the semiconductor device for comparison is mounted on a wiring substrate for comparison.
Figure 11:
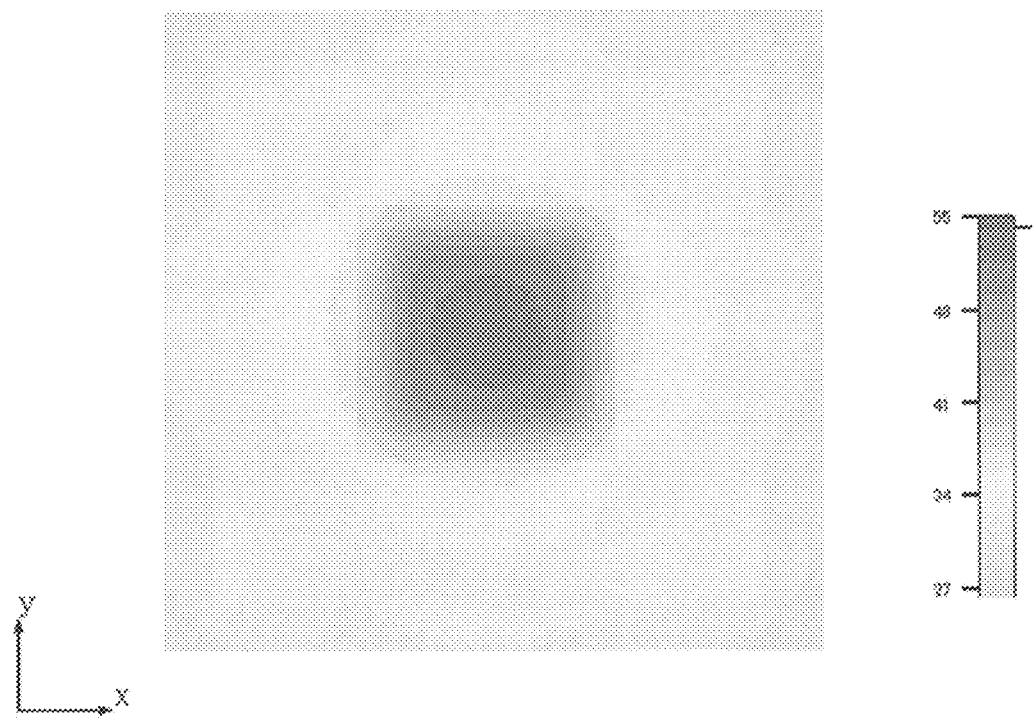
FIG. 11(a) is a diagram depicting temperature distribution in a comparison wiring substrate mounted with the comparison semiconductor device, and (b) is a diagram depicting temperature distribution in the wiring substrate mounted with the semiconductor device in FIG. 1.
Figure 11:
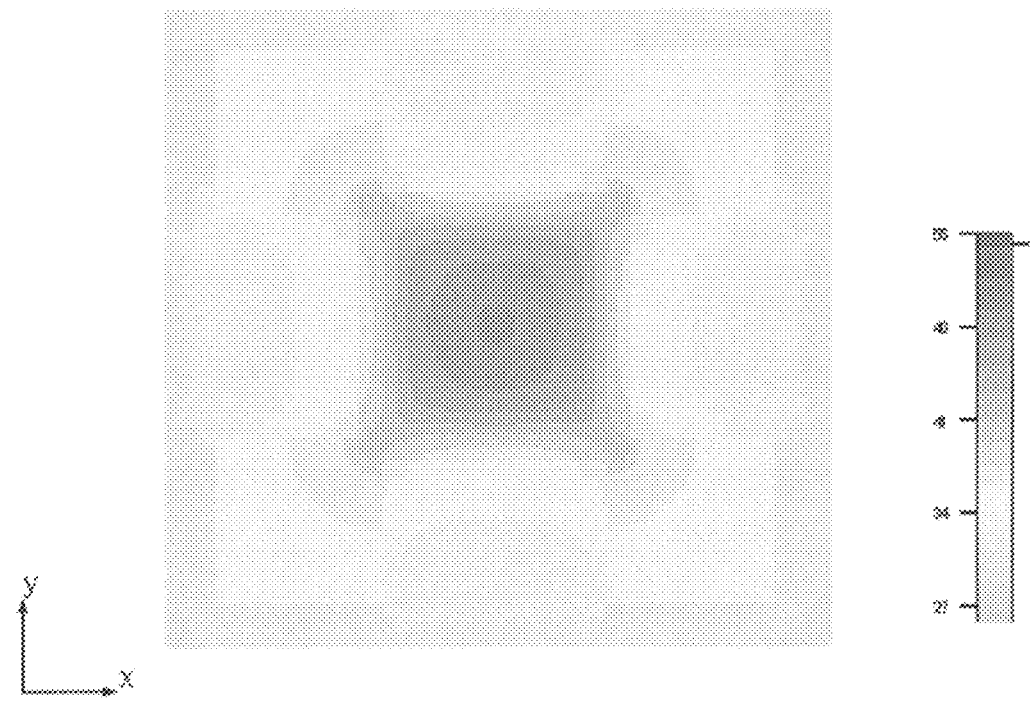

FIG. 9 to FIG. 11 are drawings for illustrating a simulated heat dissipation state in which the semiconductor device A1 is mounted on the wiring substrate 9. FIG. 9 and FIG. 10 are drawings for illustrating a semiconductor device A1' and a wiring substrate 9' used for comparison, and FIG. 11 is a drawing showing the simulation result.

FIG. 9 shows a top view of the semiconductor device A1' used for comparison, and is a drawing corresponding to FIG. 1. As shown in FIG. 9, compared to the semiconductor device A1, the semiconductor device A1' is not provided with the first terminal portions 120, and is provided with floating pins 130' in substitution for the connecting portions 130, and the second leads 2 are disposed in proximity of the floating pins 130'. FIG. 10 shows a top view of a state in which the semiconductor device A1' is mounted on the wiring substrate 9', and is a drawing corresponding to FIG. 7. Further, in FIG. 10, an imaginary line (double-dotted line) of the semiconductor device A1' indicates the contour of the semiconductor device A1'. As shown in FIG. 10, the wiring substrate 9' is a wiring substrate in which the connecting wires 94 are not disposed in the wiring substrate 9.

FIG. 11(a) shows a diagram of temperature distribution in the wiring substrate 9' mounted with the semiconductor device A1' after heat dissipation of the semiconductor element 3. FIG. 11(b) shows a diagram of temperature distribution in the wiring substrate 9 mounted with the semiconductor device A1 after heat dissipation of the semiconductor element 3. As shown in FIG. 11(a), in the wiring substrate 9' mounted with the semiconductor device A1', the temperature of only the mounting portion land 91 (near the center of FIG. 11(a)) rises. On the other hand, as shown in FIG. 11(b), in the wiring substrate 9 mounted with the semiconductor device A1, heat of the mounting portion land 91 (near the center of FIG. 11(b)) is transmitted to the first terminal portion lands 92 (near four corners of FIG. 11(b)) and is released. Thus, compared to the wiring substrate 9' (referring to FIG. 11(a)) mounted with the semiconductor device A1', the temperature of the mounting portion land 91 is lowered. Further, thermal resistance of the wiring substrate 9' mounted with the semiconductor device A1' is 34.0° C./W, and in comparison, thermal resistance of the wiring substrate 9 mounted with the semiconductor device A1 is 27.7° C./W. It is apparent that thermal resistance is lowered and the heat dissipation effect is improved.

Further, according to this embodiment, the joining portion 210 of the second lead 2 adjacent to the connecting portion 130 extends substantially in parallel to the extension direction of the connecting portion 130, and thus the connecting portion width dimension W1 is further increased.

Further, according to this embodiment, each first terminal portion 120 includes a terminal connected and formed by the first terminal portion end surface 123 exposed from the sealing resin side surface 53 and the first terminal portion back surface 122 exposed from the sealing resin back surface 52 (referring to FIG. 5). When the semiconductor device A1 is mounted on the wiring substrate 9, the terminal is bonded to the first terminal portion land 92 formed on the wiring substrate 9 by the solder 99. A welding fillet (referring to FIG. 8) formed by the solder 99 is formed on the first terminal portion end surface 123, and so the bonding state of the first terminal portion 120 may also be determined according to the appearance after mounting. Further, the welding fillet formed on the first terminal portion end surface 123 may be used to reinforce mounting strength.

Further, in this embodiment, a situation where the first terminal portion end surfaces 123, the second terminal portion end surfaces 223 and the resin side surfaces 53 of the sealing resin 5 are of the same plane is described; however, the present invention is not limited to such example. The first terminal portion end surfaces 123 and the second terminal portion end surfaces 223 may protrude from the resin side surfaces 53, or may be recessed from the resin side surfaces 53. Further, the first terminal portion end surfaces 123 and the second terminal portion end surfaces 223 may be flat or bent, or may be formed as protrusions or recesses. Further, the shapes of the first terminal portion end surfaces 123 and the second terminal portion end surfaces 223 are not specifically defined.

Figure 12:
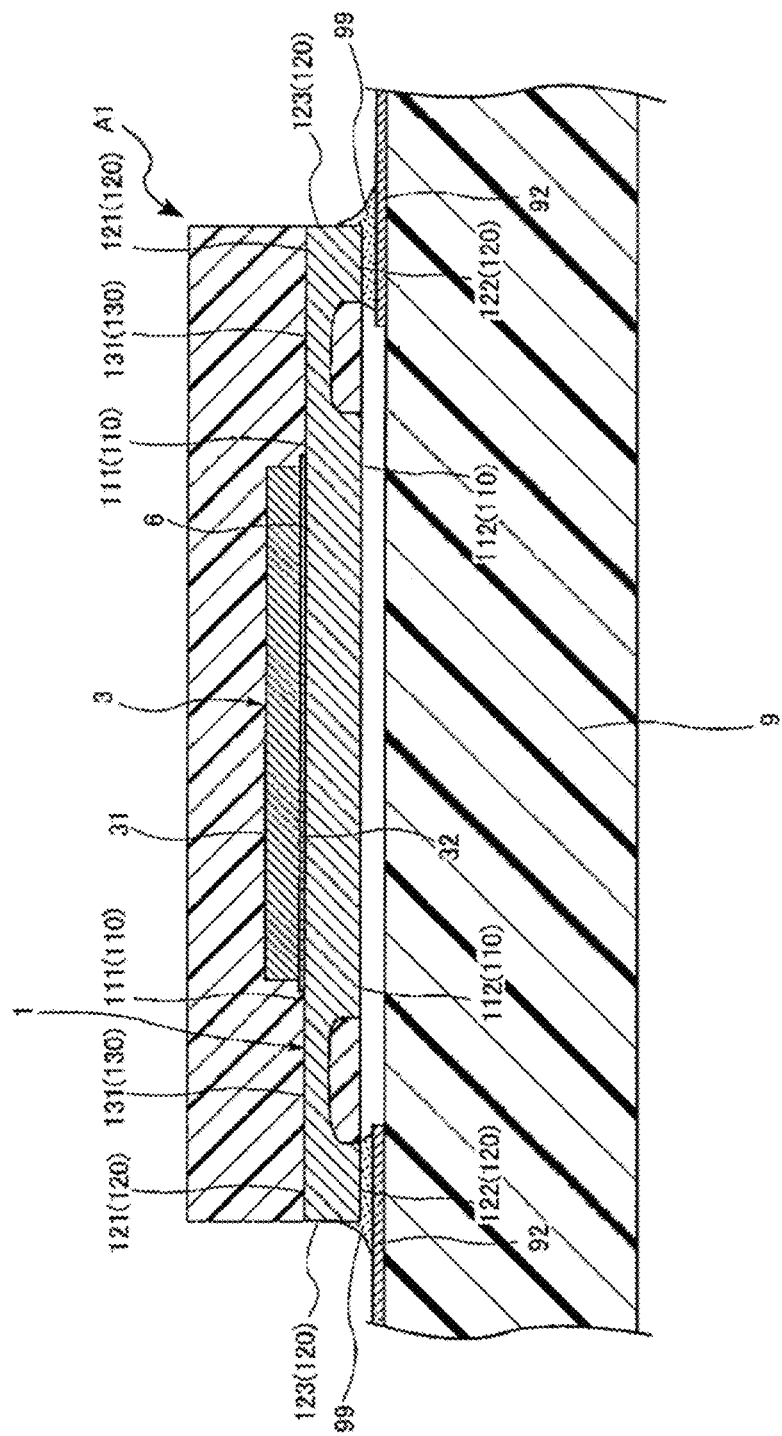
FIG. 12 is an enlarged section diagram of a main part of a state in which the semiconductor device in FIG. 1 is mounted on another wiring substrate.

Further, in this embodiment, a situation where the mounting portion back surface 112 is connected to the mounting portion land 91 is described; however, the present invention is not limited to such example. For example, as shown in FIG. 12, the wiring substrate 9 may selectively exclude the mounting portion land 91 and the connecting wires 94. In this case, the first terminal portions 120 connected to the mounting portion 110 via the connecting portions 130 are also connected to the first terminal portion lands 92. Thus, heat emitted by the semiconductor element 3 is transmitted through the mounting portion 110, the connecting portions 130 and the first terminal portions 120 to the first terminal portion lands 92 and is released. Therefore, the heat dissipation area on the surface of the wiring substrate 9 may be ensured by enlarging the area of the first terminal portion lands 92.

Second Embodiment

A semiconductor device A2 according to the second embodiment of the present invention is described with reference to FIG. 13 and FIG. 14. In these drawings, components identical or similar to those of the semiconductor device A1 are denoted by the same numerals, and repeated details are omitted.

Figure 13:
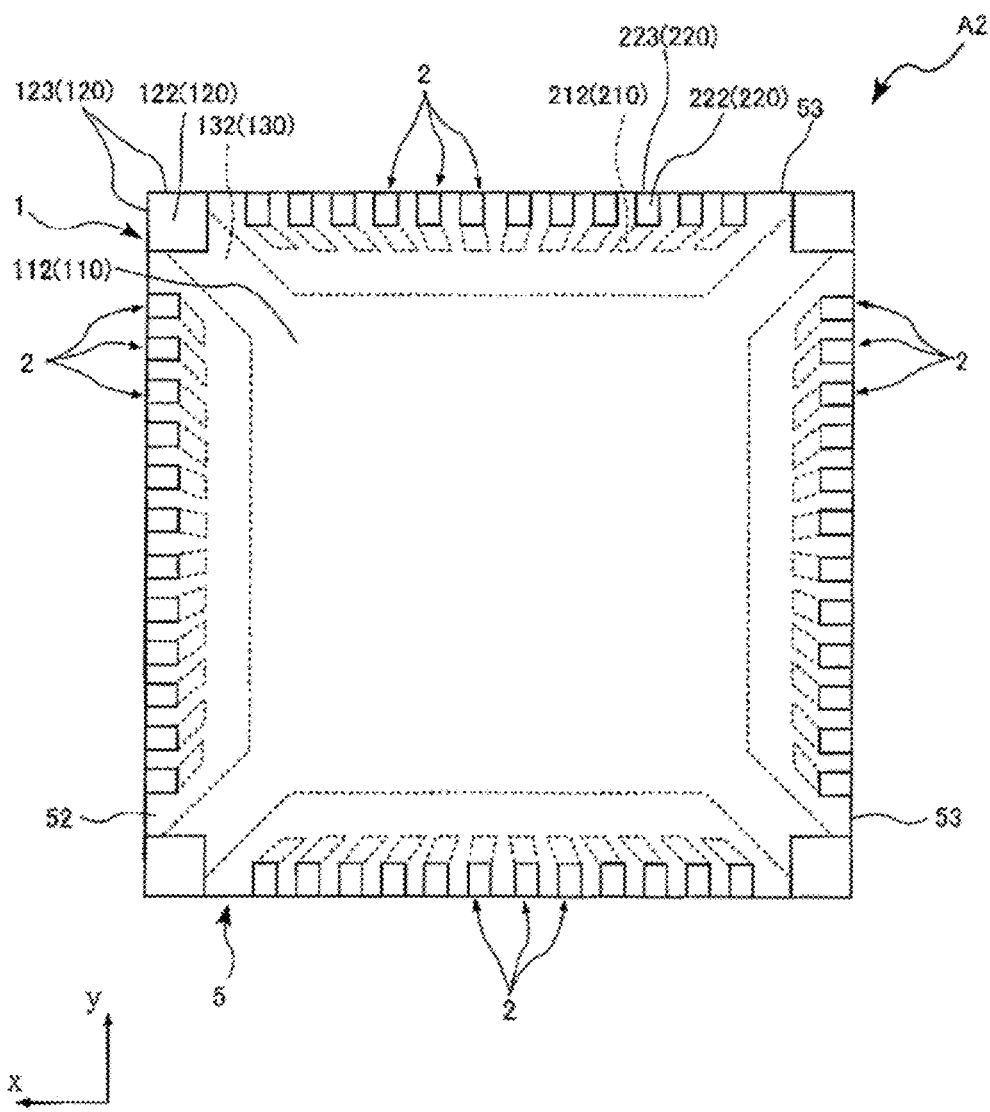
FIG. 13 is a bottom view of a semiconductor device according to a second embodiment of the present invention.
Figure 14:
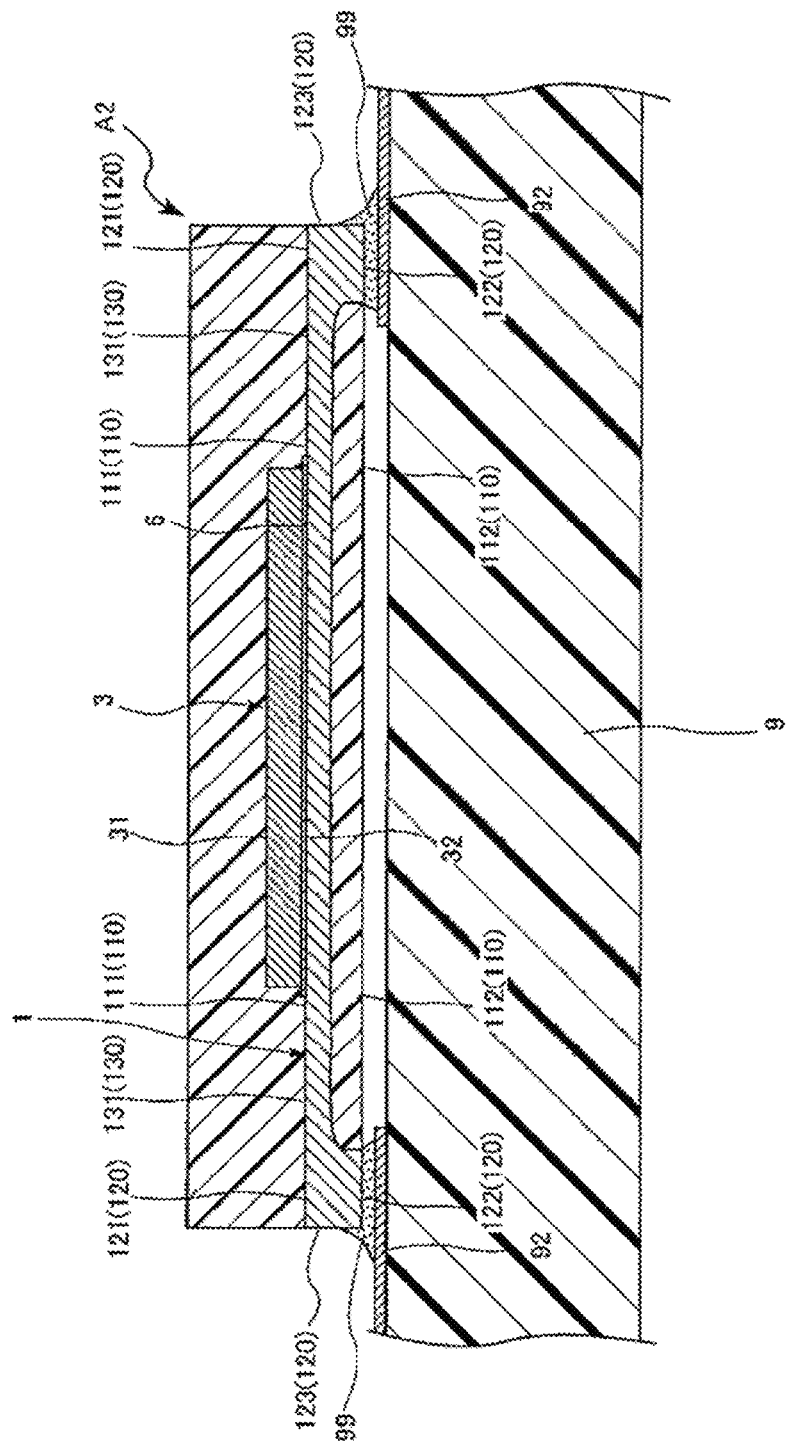
FIG. 14 is an enlarged section diagram of a main part of a state in which the semiconductor device according to the second embodiment of the present invention is mounted on a wiring substrate.

FIG. 13 shows a bottom view of the semiconductor device A2, and is a drawing corresponding to FIG. 3 of the first embodiment. FIG. 14 shows an enlarged section diagram of a main apart of a state in which the semiconductor device A2 is mounted on the wiring substrate 9, and is a drawing corresponding to FIG. 8 of the first embodiment.

The semiconductor device A2 of this embodiment differs from the semiconductor device A1 in that, the mounting portion back surfaces 112 are not exposed from the sealing resin 5. The mounting portion 110 of this embodiment has a thickness (the dimension in the z direction) equal to the thickness of the connecting portions 130, and is approximately one-half of the thickness of the first terminal portions 120. The mounting portion 110 is formed, for example, by half-etching processing. Thus, in this embodiment, the mounting portion back surface 112 is not exposed from the sealing resin 5.

In this embodiment, the first terminal portions 120 connected to the mounting portion 110 via the connecting portions 130 are also connected to the first terminal portion lands 92, and thus heat emitted by the semiconductor element 3 is transmitted through the mounting portion 110, the connecting portions 130 and the first terminal portions 120 to the first terminal portion lands 92 and is released.

Therefore, the heat dissipation area on the surface of the wiring substrate 9 may be ensured by enlarging the area of the first terminal portion lands 92.

Third Embodiment

A semiconductor device A3 according to the third embodiment of the present invention is described with reference to FIG. 15 and FIG. 16. In these drawings, components identical or similar to those of the semiconductor device A1 are denoted by the same numerals, and repeated details are omitted.

Figure 15:
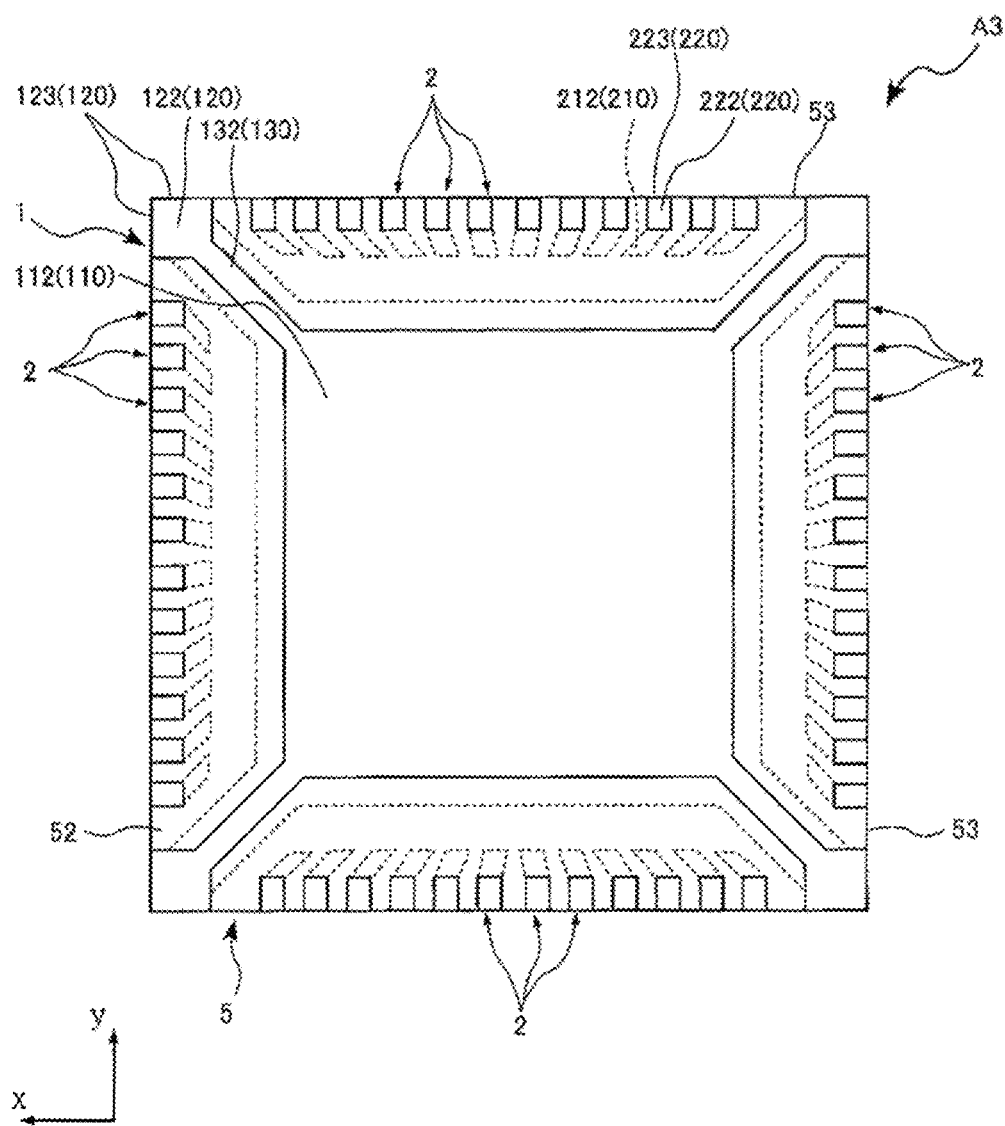
FIG. 15 is a bottom view of a semiconductor device according to a third embodiment of the present invention.
Figure 16:
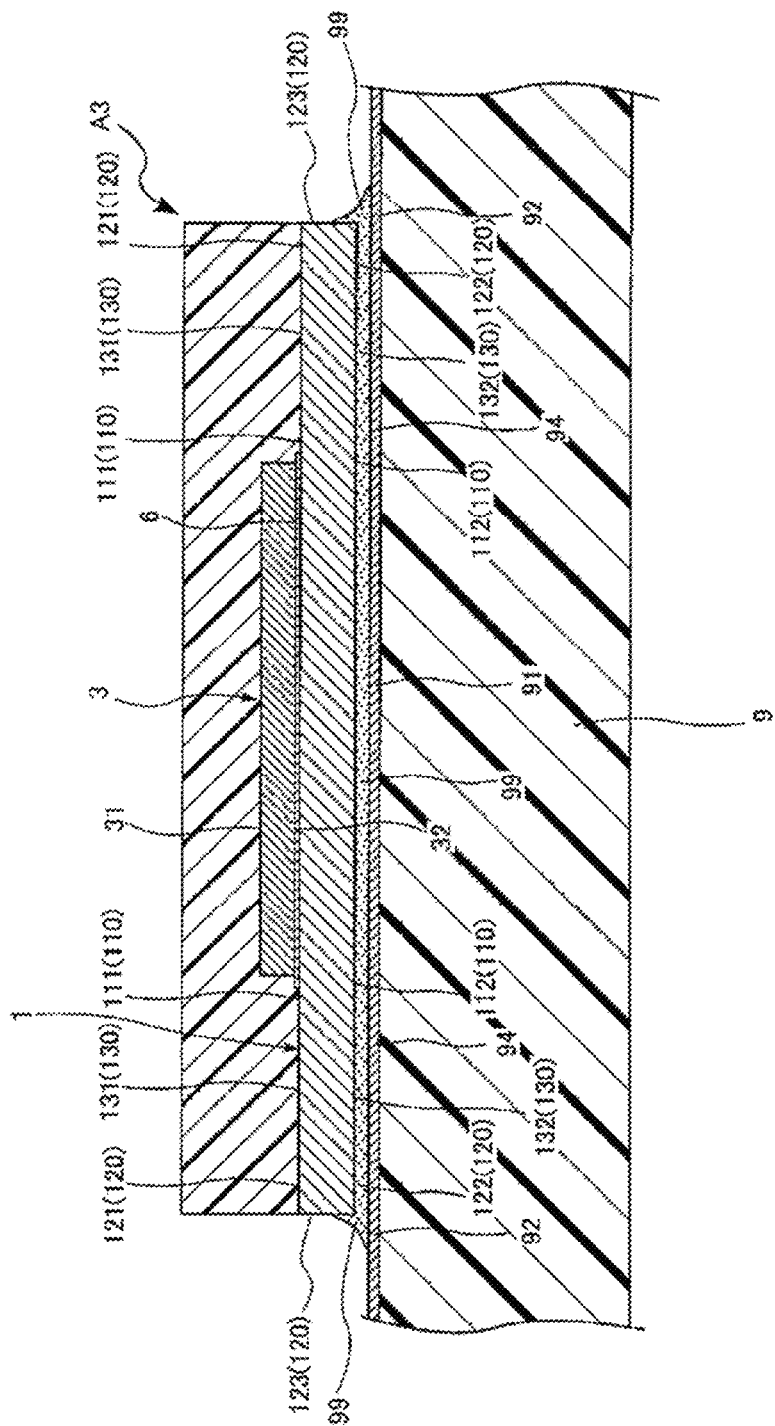
FIG. 16 is an enlarged section diagram of a main part of a state in which the semiconductor device according to the third embodiment is mounted on a wiring substrate.
Figure 17:
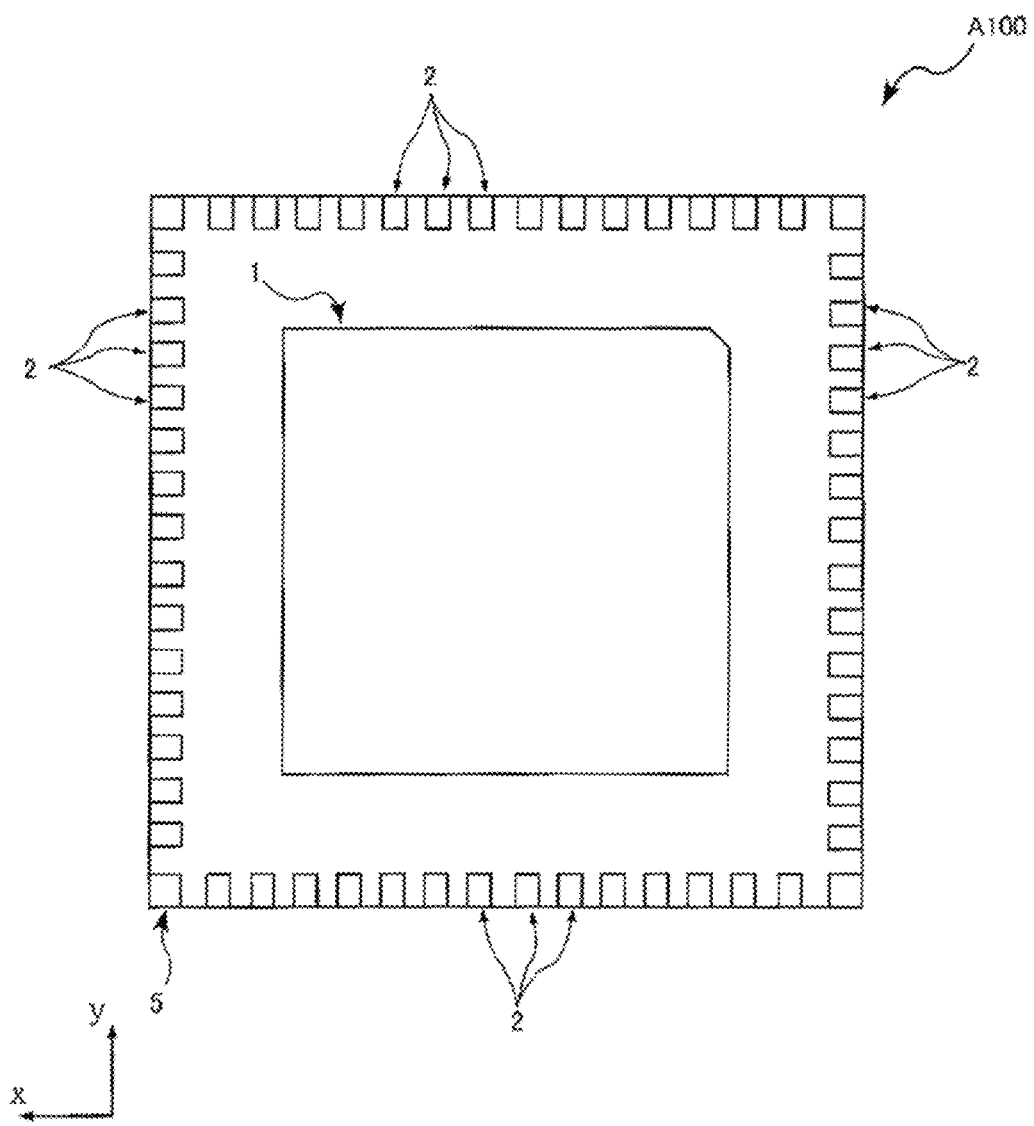
FIG. 17 is a bottom view of a conventional semiconductor device.

FIG. 15 shows a bottom view of the semiconductor device A3, and is a drawing corresponding to FIG. 3 of the first embodiment. FIG. 16 shows an enlarged section diagram of a main apart of a state in which the semiconductor device A3 is mounted on the wiring substrate 9, and is a drawing corresponding to FIG. 8 of the first embodiment.

The semiconductor device A3 of this embodiment differs from the semiconductor device A1 in that, the connecting portion back surfaces 132 are exposed from the sealing resin 5. The connecting portions 130 of this embodiment have a thickness (the dimension in the z direction) is equal to the thickness of the mounting portion 110 and the first terminal portions 120. The connecting portion back surfaces 132, the mounting portion back surface 112 and the first terminal portion back surfaces 122 are an integral surface of the same plane, and also become the same plane with the resin back surface 52. Thus, in this embodiment, the connecting portion back surfaces 132 are also exposed from the sealing resin 5. As shown in FIG. 16, the connecting portion back surfaces 132 are bonded to the connecting wires 94 by the solder 99.

In this embodiment, the effects the same with those of the first embodiment are also achieved. Hence, according to this embodiment, the connecting portions 130 have a thickness more than the thickness of the connecting portions 130 of the first embodiment, and the connecting portions 130 may more readily transmit heat from the mounting portion 110 toward the first terminal portions 120. Further, because the connecting portion back surfaces 132 are connected to the connecting wires 94, heat emitted by the semiconductor element 3 may also be transmitted to the connecting wires 94 through the connecting portions 130. Therefore, the semiconductor device A3 is capable of further promoting heat dissipation.

The semiconductor device and the mounting structures of the semiconductor device of the present invention are not limited to the examples given in the foregoing embodiments. Various design modifications may be made to the specific configurations of the components of the semiconductor device and the mounting structures of the semiconductor device of the present invention.

(Note 1)
A semiconductor device, comprising:
a semiconductor element;
a first lead, being rectangular in shape when viewed in a thickness direction, comprising a mounting portion, four connecting portion and four first terminal portions, wherein the semiconductor element is mounted on the mounting portion, the connecting portions extend from four corners of the mounting portion, respectively, and the first terminal portions are connected to front ends of the connecting portions, respectively;
a plurality of second leads, arranged, when viewed in the thickness direction, in a plurality quantity and in parallel to each edge of the mounting portion between two adjacent of the first terminal portions; and
a sealing resin, covering at least a part of each of the first lead and the second leads; wherein,
a part of each of the first terminal portions is exposed from the sealing resin,
each of the second leads comprises a second terminal and a joining portion, wherein a part of each of the second terminal portions is exposed from the sealing resin, and the joining portion extends from the second terminal portion toward the mounting portion, and
a dimension of a connecting portion width of the connecting portion is greater than a dimension of a joining portion width of the joining portion of the second lead, the dimension of the connecting portion width is a dimension in a direction perpendicular to an extension direction of the connecting portion and the thickness direction, and the dimension of the joining portion width is a dimension in a direction perpendicular to an extension direction of the joining portion and the thickness direction.

(Note 2)
The semiconductor device according to note 1, wherein the dimension of the connecting portion width is equal to or more than twice the dimension of the joining portion width.

(Note 3)
The semiconductor device according to note 1 or 2, wherein the dimension of the connecting portion width is equal to or more than 0.2 mm.

(Note 4)
The semiconductor device according to any one of notes 1 to 3, wherein a ratio of a minimum distance L2 to a minimum distance L1 is equal to or less than ¼, the minimum distance L1 is a minimum distance between two of the second leads individually adjacent to the connecting portion and interposed with the connecting portion, and the minimum distance L2 is a minimum distance between one of the second leads and the connecting portion.

(Note 5)
The semiconductor device according to any one of notes 1 to 4, wherein the mounting portion has a mounting portion main surface mounted with the semiconductor element, and a mounting back surface facing a side opposite to the mounting portion main surface in the thickness direction; and the mounting portion back surface is exposed from the sealing resin.

(Note 6)
The semiconductor device according to note 5, wherein the connecting portion has a connecting portion main surface facing a side same with the mounting portion main surface in the thickness direction, and the mounting portion main surface and the connecting portion main surface are of a same plane.

(Note 7)
The semiconductor device according to note 5 or 6, wherein the first terminal portion has a first terminal portion back surface facing a side same with the mounting portion back surface in the thickness direction, and the first terminal portion back surface is exposed from the sealing resin.

(Note 8)
The semiconductor device according to note 7, wherein the first terminal portion further has a first terminal portion end surface perpendicular to the first terminal portion back surface and exposed from the sealing resin.

(Note 9)
The semiconductor device according to any one of notes 5 to 8, wherein the connecting portion is covered by the sealing resin.

(Note 10)

The semiconductor device according to any one of claims 5 to 9, wherein the connecting portion has a connecting portion back surface facing a side same with the mounting portion back surface in the thickness direction, and the connecting portion back surface is exposed from the sealing resin.

(Note 11)

The semiconductor device according to any one of notes 5 to 10, wherein the extension direction of the joining portion of each of the second leads inclines relative to an extension direction of the second terminal portion, and becomes more inclined as getting closer to the second lead of the connecting portion.

(Note 12)

The semiconductor device according to any one of notes 5 to 11, wherein the extension direction of the joining portion of the second lead adjacent to the connecting portion is substantially parallel to the extension direction of the connecting portion.

(Note 13)

A mounting structure, comprising:
the semiconductor device according to any one of notes 5 to 12; and
a wiring substrate for mounting the semiconductor device, the wiring substrate comprising:
  a mounting portion land, bonded to the mounting portion back surface;
  four first terminal portion lands, bonded to the first terminal portions, respectively;
  a plurality of second terminal portion lands, bonded to the second terminal portions, respectively; and
  four connecting wires, connected to the mounting portion land and the first terminal portion lands, respectively.

(Note 14)

The mounting structure according to note 13, wherein the second terminal portion lands extend toward the mounting portion land; and a dimension of a connecting wire width of the connecting wire is greater than a dimension of a second terminal portion land width of the second terminal portion land adjacent to the connecting wire, the dimension of the connecting wire width is a dimension in a direction perpendicular to an extension direction of the connecting wire and the thickness direction, and the dimension of the second terminal portion land width is a dimension in a direction perpendicular to an extension direction of the second terminal portion land and the thickness direction.

(Note 15)

The mounting structure according to note 14, wherein the dimension of the connecting wire width is equal to or more than twice the dimension of the second terminal portion land width.

(Note 16)

The mounting structure according to note 14 or 15, wherein the dimension of the connecting wire width is equal to or more than 0.2 mm.

(Note 17)

The mounting structure according to any one of notes 14 to 16, wherein a ratio of a minimum distance L4 to a minimum distance L3 is equal to or less than ¼, the minimum distance L3 is a minimum distance between two of the second terminal portion lands individually adjacent to the connecting wire and interposed with the connecting wire, and the minimum distance L4 is a minimum distance between one of the second terminal portion lands and the connecting wire.

What is claimed is:

1. A semiconductor device, comprising:
a semiconductor element;
a first lead, being rectangular in shape when viewed in a thickness direction, comprising a mounting portion, four connecting portions and four first terminal portions, wherein the semiconductor element is mounted on the mounting portion, the connecting portions extend from four corners of the mounting portion, respectively, and the first terminal portions are connected to front ends of the plurality of connecting portions respectively;
a plurality of second lead, arranged, when viewed in the thickness direction, in a plural quantity in parallel to each edge of the mounting portion between the adjacent first terminal portions; and
a sealing resin, covering at least a part of each of the first lead and the second leads;
wherein,
a part of each first terminal portion is exposed from the sealing resin,
each second lead comprises a second terminal portion and a joining portion, a part of the second terminal portion is exposed from the sealing resin, and the joining portion extends from the second terminal portion toward the mounting portion, and
a connecting portion width of the connecting portion is greater than a joining portion width of the joining portion, the connecting portion width is a dimension in a direction perpendicular to an extension direction of the connecting portion and the thickness direction, and the joining portion width is a dimension in a direction perpendicular to an extension direction of the joining portion and the thickness direction,
wherein each of the first terminal portions includes a rectangular shape from a top view perspective, wherein the rectangular shape has two sides flushed with adjacent sides of the sealing resin, in which the rectangular shape includes a side having a width greater than a width of the second terminal portion and each of the first terminal portions covers an entirety of one of the four corners, and
wherein a thickness of the first terminal portion is greater than a thickness of the connecting portion.

2. The semiconductor device according to claim 1, wherein the dimension of the connecting portion width is equal to or more than twice the dimension of the joining portion width.

3. The semiconductor device according to claim 2, wherein the dimension of the connecting portion width is equal to or more than 0.2 mm.

4. The semiconductor device according to claim 1, wherein the dimension of the connecting portion width is equal to or more than 0.2 mm.

5. The semiconductor device according to claim 1, wherein a ratio of a minimum distance L2 to a minimum distance L1 is equal to or less than ¼, the minimum distance L1 is a minimum distance between two of the second leads respectively adjacent to the connecting portion and interposed with the connecting portion, and the minimum distance L2 is a minimum distance between one of the second leads and the connecting portion.

6. The semiconductor device according to claim 1, wherein the mounting portion comprises a mounting portion main surface mounted with the semiconductor element, and a mounting back surface facing a side opposite to the mounting portion main surface in the thickness direction; and the mounting portion back surface is exposed from the sealing resin.

7. The semiconductor device according to claim 6, wherein the connecting portion comprises a connecting portion main surface facing a side same with the mounting portion main surface in the thickness direction, and the mounting portion main surface and the connecting portion main surface are coplanar.

8. The semiconductor device according to claim 7, wherein the first terminal portion comprises a first terminal portion back surface facing a side same with the mounting portion back surface in the thickness direction, and the first terminal portion back surface is exposed from the sealing resin.

9. The semiconductor device according to claim 6, wherein the first terminal portion comprises a first terminal portion back surface facing a side same with the mounting portion back surface in the thickness direction, and the first terminal portion back surface is exposed from the sealing resin.

10. The semiconductor device according to claim 9, wherein the first terminal portion further comprises a first terminal portion end surface perpendicular to the first terminal portion back surface and exposed from the sealing resin.

11. The semiconductor device according to claim 6, wherein the connecting portion is covered by the sealing resin.

12. The semiconductor device according to claim 6, wherein the connecting portion comprises a connecting portion back surface facing a side same with the mounting portion back surface in the thickness direction, and the connecting portion back surface is exposed from the sealing resin.

13. The semiconductor device according to claim 6, wherein the extension direction of the joining portion of each of the second leads inclines relative to an extension direction of the second terminal portion, and becomes more inclined as getting closer to the second lead of the connecting portion.

14. The semiconductor device according to claim 6, wherein the extension direction of the joining portion of the second lead adjacent to the connecting portion is substantially parallel to the extension direction of the connecting portion.

15. A mounting structure, comprising:
a semiconductor device according to claim 6; and
a wiring substrate, for mounting the semiconductor device, the wiring substrate comprising:
a mounting portion land, bonded to the mounting portion back surface;
four first terminal portion lands, bonded to the first terminal portions, respectively;
a plurality of second terminal portion lands, bonded to the second terminal portions, respectively; and
four connecting wires, connected to the mounting portion land and the first terminal portion lands, respectively.

16. The mounting structure according to claim 15, wherein the second terminal portion lands extend toward the mounting portion land; and
a dimension of a connecting wire width of the connecting wire is greater than a dimension of a second terminal portion land width of the second terminal portion land adjacent to the connecting wire, the dimension of the connecting wire width is a dimension in a direction perpendicular to an extension direction of the connecting wire and the thickness direction, and the dimension of the second terminal portion land width is a dimension in a direction perpendicular to an extension direction of the second terminal portion land and the thickness direction.

17. The mounting structure according to claim 16, wherein the dimension of the connecting wire width is equal to or more than twice the dimension of the second terminal portion land width.

18. The mounting structure according to claim 17, wherein the dimension of the connecting wire width is equal to or more than 0.2 mm.

19. The mounting structure according to claim 16, wherein the dimension of the connecting wire width is equal to or more than 0.2 mm.

20. The mounting structure according to claim 16, wherein a ratio of a minimum distance L4 to a minimum distance L3 is equal to or less than ¼, the minimum distance L3 is a minimum distance between two of the second terminal portion lands respectively adjacent to the connecting wire and interposed with the connecting wire, and the minimum distance L4 is a minimum distance between one of the second terminal portion lands and the connecting wire.

* * * * *